United States Patent
Minato et al.

(10) Patent No.: US 8,269,655 B2
(45) Date of Patent: Sep. 18, 2012

(54) KEY CONTROL CIRCUIT, ELECTRONIC APPARATUS, PORTABLE DEVICE, AND KEY CONTROL METHOD

(75) Inventors: Kiyomi Minato, Kawasaki (JP); Satoru Ueyama, Kato (JP)

(73) Assignee: Fujitsu Limited, Kawasaki (JP)

( * ) Notice: Subject to any disclaimer, the term of this patent is extended or adjusted under 35 U.S.C. 154(b) by 1146 days.

(21) Appl. No.: 12/112,689

(22) Filed: Apr. 30, 2008

(65) Prior Publication Data

US 2008/0316066 A1    Dec. 25, 2008

(30) Foreign Application Priority Data

Jun. 19, 2007    (JP) ................ 2007-161580

(51) Int. Cl.
  *H03M 11/00*    (2006.01)
(52) U.S. Cl. ............... 341/24; 341/20; 341/22; 341/26; 455/575.3
(58) Field of Classification Search ........... 341/20–35; 455/73, 575.1, 575.3; 200/5 B, 5 C, 43.01–43.22; 713/320, 310, 324; 345/168, 173
  See application file for complete search history.

(56) References Cited

U.S. PATENT DOCUMENTS

| | | | |
|---|---|---|---|
| 4,502,039 A * | 2/1985 | Vercesi et al. | 341/26 |
| 7,774,029 B2 * | 8/2010 | Lee et al. | 455/566 |
| 7,797,020 B2 * | 9/2010 | Sawayama et al. | 455/556.1 |
| 2004/0063474 A1 | 4/2004 | Yasui et al. | |
| 2004/0116167 A1 | 6/2004 | Okuzako et al. | |
| 2006/0035677 A1 * | 2/2006 | Aerrabotu et al. | 455/565 |
| 2007/0135091 A1 * | 6/2007 | Wassingbo | 455/410 |

FOREIGN PATENT DOCUMENTS

| | | |
|---|---|---|
| JP | 1-314424 | 12/1989 |
| JP | 4-256116 | 9/1992 |
| JP | 4-259156 | 9/1992 |

(Continued)

OTHER PUBLICATIONS

Japanese Office Action issued Apr. 26, 2011 in corresponding Japanese Patent Application 2007-161580.
Korean Office Action issued Nov. 26, 2009 in corresponding Korean Patent Application 10-2008-0040054.
Partial translation of Japanese Published Patent Application 2005-277627.
Japanese Office Action mailed Nov. 8, 2011 in corresponding Japanese Patent Application No. 2007-161580.

*Primary Examiner* — George Bugg
*Assistant Examiner* — Franklin Balseca
(74) *Attorney, Agent, or Firm* — Staas & Halsey LLP

(57) ABSTRACT

Key control for a key matrix circuit having a plurality of keys is provided to reduce power consumption in key searching caused by unintended key pressing. In key control on the key matrix circuit having a plurality of rows and columns of keys (key switches) in matrix arrangement, keys are disabled or enabled in row lines or in column lines on the key matrix circuit by any one of the lines through key selection by a key selecting means (opening/closing detection circuit, opening/closing detecting unit, key selection switch, key selecting unit). Following key selection, a control means (control unit) keeps key pressing detection in a standby status for a predetermined time in response to an event of detection of a press of a key included in enabled keys, and resumes the key pressing detection after the passage of the predetermined time.

15 Claims, 21 Drawing Sheets

FOREIGN PATENT DOCUMENTS

| | | |
|---|---|---|
| JP | 8-194570 | 7/1996 |
| JP | 9-64803 | 3/1997 |
| JP | 10-93669 | 4/1998 |
| JP | 10-200782 | 7/1998 |
| JP | 2004-128814 | 4/2004 |
| JP | 2005-215804 | 8/2005 |
| JP | 2005-277627 | 10/2005 |
| JP | 2006-4052 | 1/2006 |
| KR | 10-2004-0012590 | 2/2004 |

\* cited by examiner

KEY CONTROL CIRCUIT, ELECTRONIC APPARATUS, PORTABLE DEVICE, AND KEY CONTROL METHOD

CROSS-REFERENCE TO RELATED APPLICATIONS

This application is based upon and claims the benefit of priority from the prior Japanese Patent Application No. 2007-161580, filed on Jun. 19, 2007, the entire contents of which are incorporated herein by reference.

BACKGROUND OF THE INVENTION

1. Field of the Invention

The present invention relates generally to key control in an electronic apparatus, a portable device, etc., which have a key matrix circuit, and, more particularly, to a key control circuit, an electronic apparatus, a portable device, and a key control method that suppress current consumption resulting from unintended key pressing.

2. Description of the Related Art

A portable terminal device is one form of an electronic apparatus having a plurality of keys and a built-in key matrix circuit that detects pressing of any one of the keys. Such a portable terminal device has now evolved into a third generation portable device, which comes to have enlarged functions and a smaller and thinner housing. The portable terminal device is put in a bag or a pocket of a garment to be carried around, and is likely to be under pressure load when carried around. Aside from natural load that arises when portable terminal device is carried, the portable terminal device may also be subjected to additional pressure load that is caused by a user's attaching a "peeking preventive sheet" or "key top face seal". As the portable terminal device acquires improved fashionableness in addition to a call function and an information processing function, this tendency of additional pressure load is expected to become stronger and more extensive.

Japanese Patent Application Laid-Open Publication No. 2006-4052 discloses a key matrix circuit device related to a key matrix circuit used in an electronic apparatus such as a portable device. The key matrix circuit device includes a key matrix circuit unit having matrix wiring consisting of m×n (m, n≧3) lines with key switches each located at the intersection between lines, and scans the state of keys through a change in the state of an I/O port of a CPU to recognize simultaneous pressing of three or more keys resulting from any given one or two input events (see ABSTRACT, FIG. 1, etc.).

Japanese Patent Application Laid-Open Publication No. H09-64803 discloses a cellular phone related to the prevention of misoperation of keys on a keyboard, etc. The cellular phone has a key misoperation preventive function working in such a way that when a key on the keyboard is pressed, a key pressing detecting unit detects a press of the key, and, when a misoperation preventive key is on, a misoperation preventive detecting unit sends a misoperation preventive signal to a control unit to cause the control unit to disable the press of the key on the keyboard. When a key is pressed when the misoperation preventive key is active, therefore, the cellular phone turns on a light-emitting diode (see ABSTRACT, FIG. 1, etc.).

Japanese Patent Application Laid-Open Publication No. 2004-128814 discloses preventing contact between an operation unit and a display unit in a foldable portable device having the operation unit carrying keys. In the portable device, a recession deeper than the height of a projecting operation device of the operation unit is formed on a housing contact face of a housing at the display unit side to prevent the contact (see ABSTRACT, FIG. 1, etc.).

Some portable devices can be shifted in shape. Such portable devices include one that is changed from a closed state (folded state) to an opened state and vice versa, one that allows an operation unit to be slid out, and one that, when closed, allows part of a housing to be rotated and exposed. An openable/closable portable device poses a problem when its housing becomes thinner and a so-called clearanceless effort progresses to reduce a gap between a fixed side housing unit and a movable side housing unit. The problem is that foreign matter may come in between the fixed side housing and the movable side housing to cause an unintended key pressing. The occurrence of key pressing leads to key pressing detection, which consumes unnecessary currents. This current consumption accelerates the exhaustion of a battery.

FIG. 1 will be referred to in describing a conventional portable device having such a key matrix circuit. FIG. 1 depicts a conventional portable device having a key matrix circuit. This portable device 400 includes a key matrix circuit 402, a control unit 404, and an opening/closing detection circuit 406. For detecting key pressing, the key matrix circuit 402 has a hardware configuration, and input to a CPU included in the control unit 404 is concentrated in a single interruption line. The CPU searches for an interruption factor, i.e., a pressed key.

The key matrix circuit 402 has a plurality of key switches K11, K12 . . . K66 that are arranged in a matrix consisting of 6 rows and 6 columns. The portable device 400 equipped with this key matrix circuit 402 can be opened and closed, so that the keys not used when the portable device 400 is closed (closed state) serve as internal keys, and the keys used regardless of the state of housing units, such as side keys, serve as external keys. The external keys are, for example, the keys exposing out of the closed housing, and are expected to be used even when the portable device 400 is in the closed state. In this case, in the key matrix circuit 402, key switches K14a, K24a, K33a, K43a, K53a, and K64a selected from the key switches K11, K12 . . . K66 are determined to be the external keys, and the other key switches K11, K12 . . . K66 excluding the external keys are determined to be the internal keys. On the line of the key switches K33a, K43a, and K53a, key switches K13b, K23b, and K63b serving as internal keys are situated. On the line of the key switches K14a, K24a, and K64a, key switches K34b, K44b, and K54b serving as internal keys are situated. This means that when the portable device 400 is in the closed state to mask the internal keys, the key switches K13b, K23b, K34b, K44b, K54b, and K63b on the lines carrying the external keys cannot be masked because detection of a press of an external key have to be allowed.

The control unit 404 carries out key pressing on the key matrix circuit 402 and detection of a pressed key as well. The control unit 404 detects key pressing on the key matrix circuit 402 through a common matrix concentrative interruption line 408, and, to search for a place of key pressing that is an interruption factor, i.e., a pressed key, gives a key detection control signal to the column lines of the key matrix circuit 402 through key detection control lines 410, and then takes in a key detection signal indicating the pressed key from the row line side of the key matrix circuit 402 through key detection lines 412.

Since the portable device 400 can be opened and closed, the opening/closing detection circuit 406 detects opening and closing of the housing, and the control unit 404 receives an opening/closing detection signal from the opening/closing detection circuit 406 to carry out masking control on the key matrix circuit 402.

FIG. 2 will be referred to in describing the operation of the portable device 400 having such a key matrix circuit 402. FIG. 2 is a flowchart of a procedure of key control.

In this procedure, when the opening/closing detection circuit 406 detects the closed state, detection of a press (key interruption) of any one of the key switches K13b, K23b, K34b, K44b, K54b, and K63b serving as internal keys is carried out (step S1). If any one of the key switches K13b, K23b, K34b, K44b, K54b, and K63b is pressed (YES at step S1), the key interruption is ignored (step S2), and key releasing detection (polling) is carried out until the pressed key is released (step S3).

FIG. 3 will be referred to in describing control carried out by the control unit 404. FIG. 3 is a timing chart of key control.

In FIG. 3, A denotes detection output from the opening/closing detection circuit 406, representing the opened/closed state of the portable device 400 by expressing the opened state as "opened" and the closed state as "closed". When any one of the key switches K13b, K23b, K34b, K44b, K54b, and K63b in a released state is pressed when the portable device 400 is in the closed state, as shown in B, key pressing interruption occurs in response to an event of the key pressing, which changes the operation status of the CPU (Central Processing Unit) of the control unit 404 from a standby status to an awake status, as shown in C. As a result, as shown in D, key detection changes from an interruption status in the closed state to a polling status, which is maintained until the pressed key is released. When the polling status is canceled, the CPU becomes the standby status, at which key detection becomes the interruption status.

Once an internal key is pressed, polling starts to detect the release of the pressed internal key, and continues till the release of the pressed key. Since the CPU remains awake to keep polling, current is consumed at the CPU side. If an external key is pressed in this situation, the on-going polling enables detection of the press of the external key. When the release of the internal key is detected through polling, key detection returns to interruption key detection as the CPU returns to the standby status.

In this case, a press of an external key must be detected even when the portable device 400 is closed, so that all key pressing events cannot be masked when internal keys and external keys are present together in the key matrix circuit 402.

Because of this, according to the portable device 400, when an internal key supposed to be unused in the closed state is pressed for any reason, detection of the press of the internal key is continued in a polling process to consume current. To suppress unnecessary current consumption at the CPU side in this case, for example, the internal keys and the external keys may be configured as separate key matrix circuits. This approach allows masking of only the internal keys, but complicates the circuit structure and doubles the burden of a key searching function. The approach, therefore, is not recommendable.

To effectively use keys on a single key matrix circuit without increasing its scale, therefore, it is essential to place together external keys allowing pressing detection even in the closed state and internal keys not requiring pressing detection in the closed state. In such a configuration, the internal keys allowing pressing detection are present in the same manner as the external keys allowing pressing detection when most of the entire internal keys are masked. When any one of the internal keys allowing pressing detection is pressed, therefore, the pressing detection as described above is carried out, which results in unnecessary power consumption.

About these problems, Japanese Patent Application Laid-Open Publication Nos. 2006-4052, H09-64803, and 2004-128814 do not disclose or suggest anything, and do not disclose any solution to the problems, either.

SUMMARY OF THE INVENTION

An object of the present invention relates to key control on a key matrix circuit having a plurality of keys, and is to reduce power consumption in key searching that is caused by unintended key pressing.

Another object of the present invention relates to key control on a key matrix circuit having a plurality of keys, and is to improve a variation function through selection of a key operation pattern.

A still another object of the present invention relates to an openable/closable portable device, and is to provide a portable device that suppresses unnecessary current consumption caused by unintended key pressing by a user when the portable device is in a closed state, and that withstands a harsh service condition.

To achieve the above objects, the present invention relates to key control on a key matrix circuit having a plurality of rows and columns of keys in matrix arrangement, and includes a configuration, a procedure, and steps according to which a key selecting means carries out key selection to disable or enable keys in row lines or column lines on the key matrix circuit by any one of the lines, and a control means, following key selection, keeps key pressing detection in a standby state for a predetermined time in response to an event of detection of a press of a key included in enabled keys and resumes the key pressing detection after the passage of the predetermined time. "Enabled key" determined by key selection means, for example, an external key that requires key detection when a housing is brought into a closed state, and an internal key on the same line of the external key is included on the key matrix circuit, thus taken to be an enabled key. "Disabled key" determined by key selection means, for example, an internal key that does not require key detection when the housing is brought into the closed state, and the internal key on the same line of the external key is excluded on the key matrix circuit. The present invention is not limited to key control over the external keys or internal keys that is carried out on the assumption that the housing is openable and closable.

According to this configuration, power consumption resulting from detection of an unintended press of a key to be excluded from the subject of key detection among a plurality of enabled keys can be reduced after key selection, and detection of a press of a specific key included in the enabled keys is differentiated in process from detection of the same carried out before key selection. This lowers a search time density in key searching to reduce power consumption. Also, additional use of key selection from the key matrix circuit having a plurality of keys offers an advantage of an improvement in a variation function for key operation and key pressing.

Thus, to achieve the above objects, a first aspect of the present invention provides a key control circuit controlling a key matrix circuit in which keys are arranged in a plurality of rows and columns, comprising a key selecting means making the keys disabling or enabling by either line of the rows or the columns on the key matrix circuit being used as a unit; and a control means, when key selection is performed by the key selecting means, detecting a press of an enabled key, keeping key pressing detection in a standby status for a predetermined time from a time point of the press of the enabled key, and resuming the key pressing detection after passage of the predetermined time.

According to the above configuration, in response to an event of key selection by the key selecting means, key pressing detection is brought into a standby status for a predetermined time from a point of a press of the enabled key, and detection of a press of a specific key is resumed after the passage of the predetermined time. This enlarges a time interval for key detection caused by unintended key pressing, etc., after key selection, thus reduces power consumption. As described above, additional use of key selection from the key matrix circuit having a plurality of keys offers the advantage of an improvement in the variation function for key operation and key pressing.

To achieve the above objects, in the key control circuit, preferably, the control means may detect a pressed key in response to an event of a press of the key on the key matrix circuit when the key selection is not performed by the key selecting means, and may detect a pressed key in response to an event of a press of the enabled key when the key selection is performed by the key selecting means.

According to the above configuration, when key selection is not performed, detection of a pressed key is carried out in response to an event of key pressing on the matrix circuit. When key selection is performed, detection of a pressed key is carried out in response to an event of pressing of an enabled key. This does not hamper normal key detection at all, so that power consumption by key searching can be reduced in correspondence to a time interval for key detection.

To achieve the above objects, preferably, the key control circuit may comprise a time counting means starting time counting in response to an event of a press of the enabled key and outputting a time counting signal indicating passage of a predetermined time when the predetermined time has passed from the start of time counting.

If such time counting means is provided, key detection operation by the control means is stopped at the start of time counting, and, after the passage of a predetermined time, the detection operation by the control means is resumed based on a time counting signal indicating the passage of the predetermined time. The stoppage of the detection operation by the control means, which continues for the predetermined time set by the time counting means, reduces power consumption.

To achieve the above objects, a second aspect of the present invention provides an electronic apparatus having the above key control circuit. According to such a configuration, the operation and function of the key control circuit are realized by various electronic apparatuses, such as a personal computer, to achieve the above objects.

To achieve the above objects, a third aspect of the present invention provides a portable device having the above key control circuit. According to such a configuration, the operation and function of the key control circuit are realized by a portable device, such as a cellular phone and portable terminal unit, to achieve the above objects.

To achieve the above objects, a fourth aspect of the present invention provides a portable device provided with a first housing having a receiver and a display unit, and a second housing having a transmitter and a key operation unit, the first and second housings being foldable via a joining unit, and the second housing provided with an inside operation key that exists on an inside when being in a folded state and an outside operation key that exists on an outside when being in the folded state, the portable device comprising: a folding detecting means detecting whether or not the first housing and second housing are folded; a first key detecting unit detecting which key is pressed when the inside operation key or the outside operation key is pressed; and a second key detecting unit detecting a press of the outside operation key at a regular interval when folding of the first housing and second housing is detected by the folding detecting means and a press of the inside operation key is detected.

According to the above configuration, power-saving key control is carried out in a portable device, such as a foldable cellular phone, which is in a closed state. For example, when a key pressing state not caused by user operation continues for a long time due to the ingress of foreign matter into a gap between a key arrangement face and an housing opposite thereto, unnecessary current consumption by the key pressing is suppressed by power-saving key control.

To achieve the above objects in the portable device, preferably, the second key detecting unit may detect a press of the outside operation key at a regular interval if folding of the first housing and second housing is detected by the folding detecting means and a press of the outside operation key is detected.

In the above configuration, power-saving key control is carried out in a portable device, such as a foldable cellular phone, which is in a closed state. For example, when a key pressing state not caused by user operation continues for a long time due to the ingress of foreign matter into a gap between a key arrangement face and an housing opposite thereto, unnecessary current consumption by the key pressing is suppressed by power-saving key control.

To achieve the above objects, in the portable device, preferably, the first housing and/or the second housing may be provided with a detecting means that detects whether or not the first housing and the second housing are folded.

According to the above configuration, a control signal indicating a closed state is obtained from a detecting means in a portable device having a folding function.

To achieve the above objects, a fifth aspect of the present invention provides a key control method for controlling a key matrix circuit in which keys are arranged in a plurality of rows and columns, comprising the steps of selecting the key by making the keys disabling or enabling by either line of the rows or the columns on the key matrix circuit being used as a unit; and detecting a pressed key at a predetermined time interval when the key selection is not performed, and stopping detection of key pressing during a time span from a press of an enabled key until passage of a predetermined time and resuming the detection of key pressing after the passage of the predetermined time when the key selection is performed.

According to the above control method, in response to an event of key selection, key pressing detection is stopped during a time span between a press of an enabled key and the passage of a predetermined time, and, after the passage of the predetermined time, key pressing detection is resumed. This enlarges a time interval for key detection caused by unintended key pressing, etc., after key selection, thus reduces power consumption. Besides, additional use of key selection from the key matrix circuit having a plurality of keys offers an advantage of an improvement in a variation function for key operation and key pressing.

To achieve the above objects, preferably, the key control method may comprise a step of detecting a pressed key in response to an event of a press of the key on the key matrix circuit when the key selection is not performed and detecting a pressed key in response to an event of a press of the enabled key when the key selection is performed.

According to the above configuration, when key selection is not performed, detection of a pressed key is carried out in response to an event of key pressing on the matrix circuit. When key selection is performed, detection of a pressed key is carried out in response to an event of pressing of any one of enabled keys excluding specific keys. This does not hamper normal key detection at all and merely extends a time interval for key detection, so that power consumption by key searching can be reduced.

To achieve the above objects, preferably, the key control method may comprise a step of starting time counting in response to an event of a press of the enabled key and outputting a time counting signal indicating passage of a predetermined time when the predetermined time has passed from the start of time counting.

According to the above configuration, power consumption is reduced through an interval of a predetermined time that is set by a time counting means.

Features and advantages of the present invention are listed as follows.

(1) A key on the key matrix circuit is determined to be enabled or disabled through key selection by the key selecting means for determining enablement or disablement, and then, in response to an event of a press of an enabled key, key detection is carried out at predetermined time intervals. This reduces current consumption in correspondence to the time intervals, allowing energy-saving operation.

(2) The enablement and disablement of key pressing is determined on keys on the key matrix circuit. This allows key selection through determination of enablement and disablement and key pressing, thus improves variation in key operation.

(3) Disabled keys are determined among keys on the key matrix circuit, and a time interval for key detection is set to carry out key detection for enabled keys. This reduces power consumption by unintended key pressing.

(4) In a portable device having a folding function, etc., unnecessary current consumption by unintended key pressing is suppressed.

(5) In an apparatus equipped with a battery, unnecessary current consumption is suppressed to check excessive energy consumption due to unnecessary current consumption by the battery, which extends the service time of the battery.

Other objects, features, and advantages of the present invention will be understood more clearly by seeing the accompanying drawings and embodiments.

DETAILED DESCRIPTION OF THE PREFERRED EMBODIMENTS

First Embodiment

Figure 1:
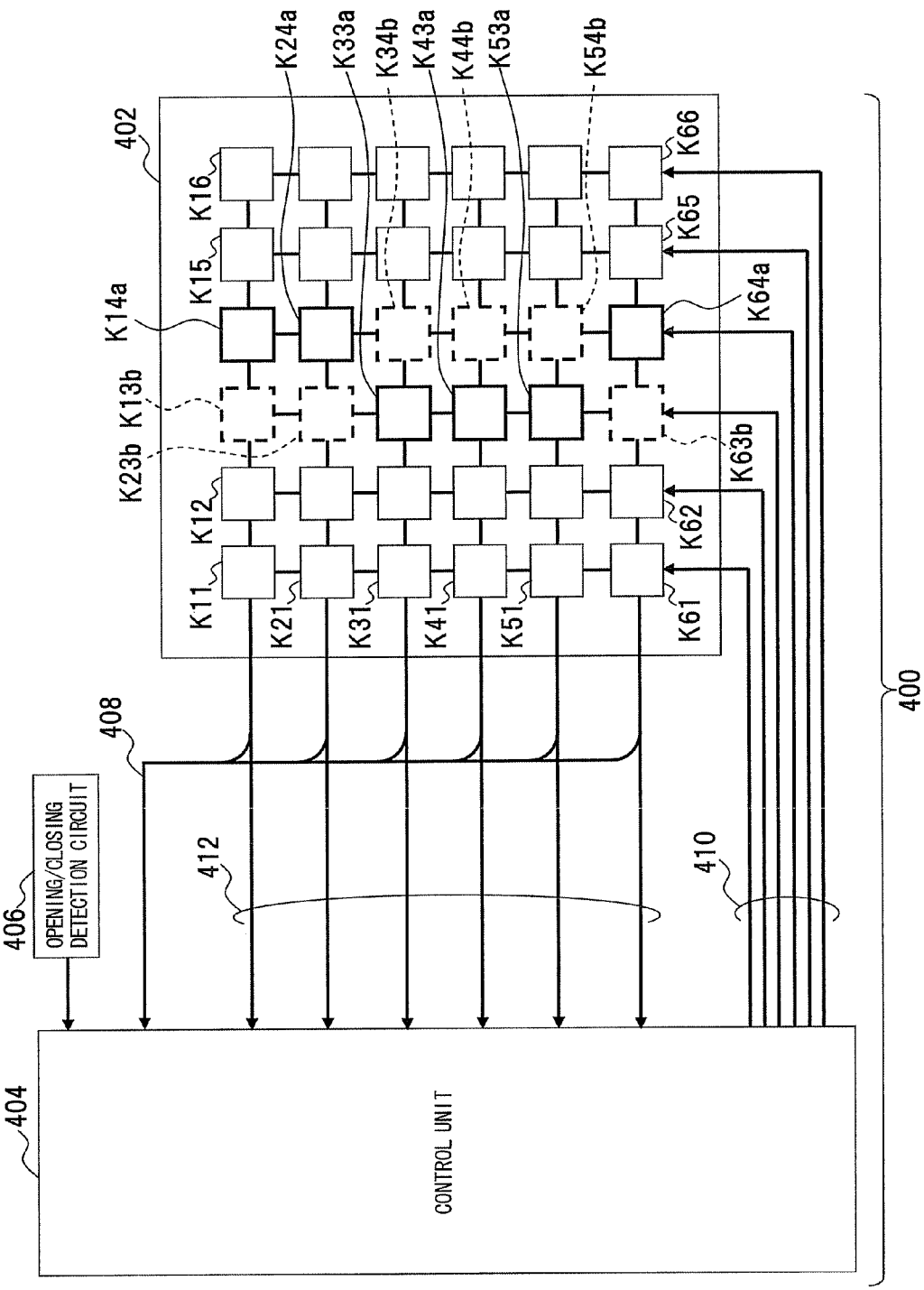
FIG. 1 depicts a portable device having a key matrix circuit.
Figure 2:
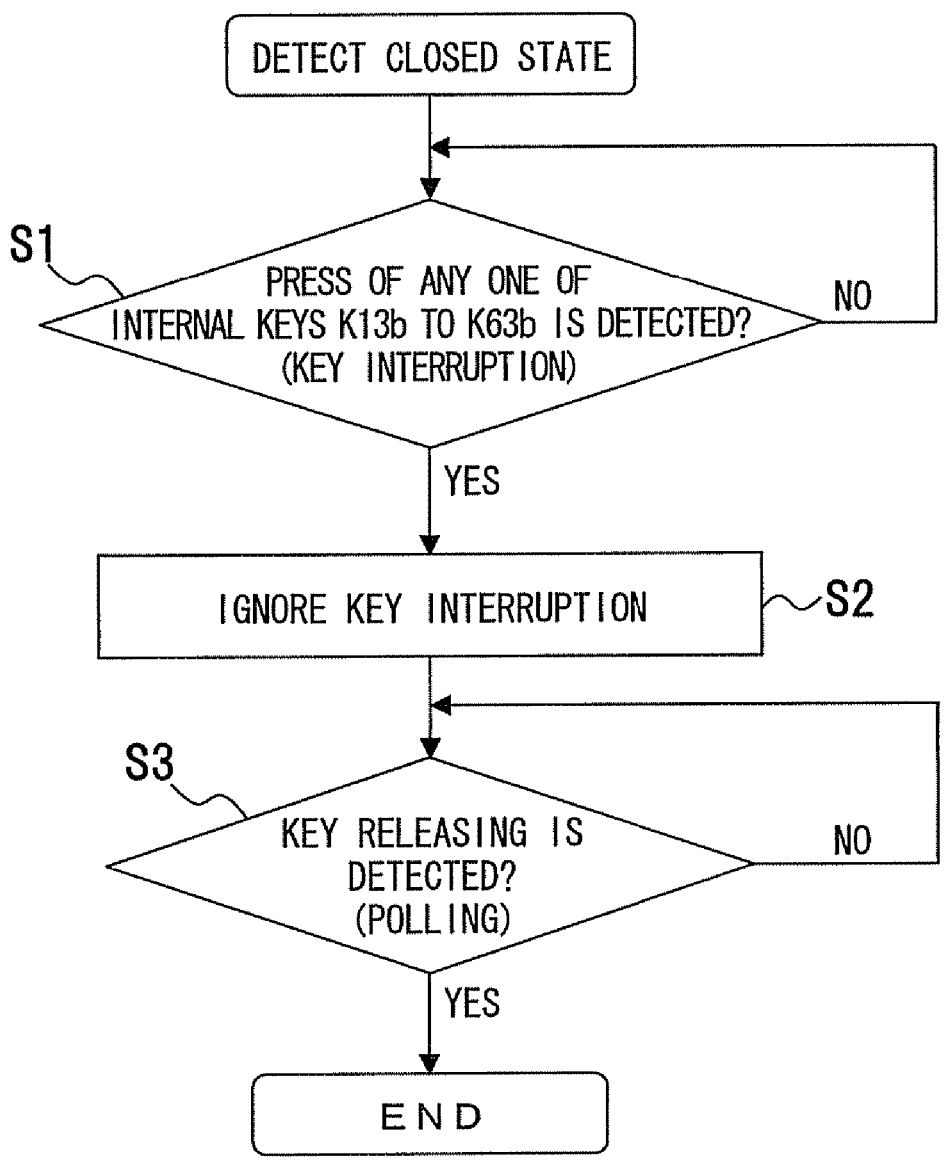
FIG. 2 is a flowchart of control operation by the portable device.
Figure 3:
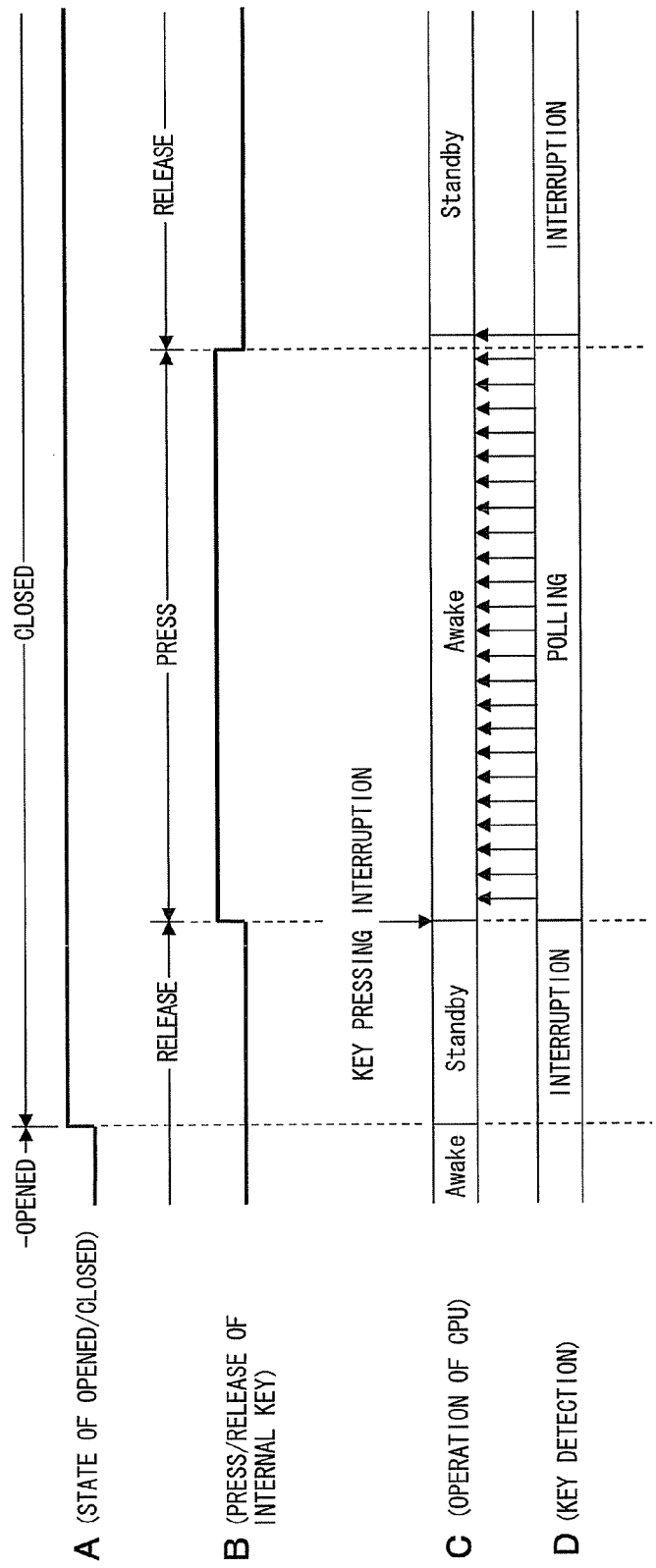
FIG. 3 is a timing chart of key searching operation by the portable device.
Figure 4:
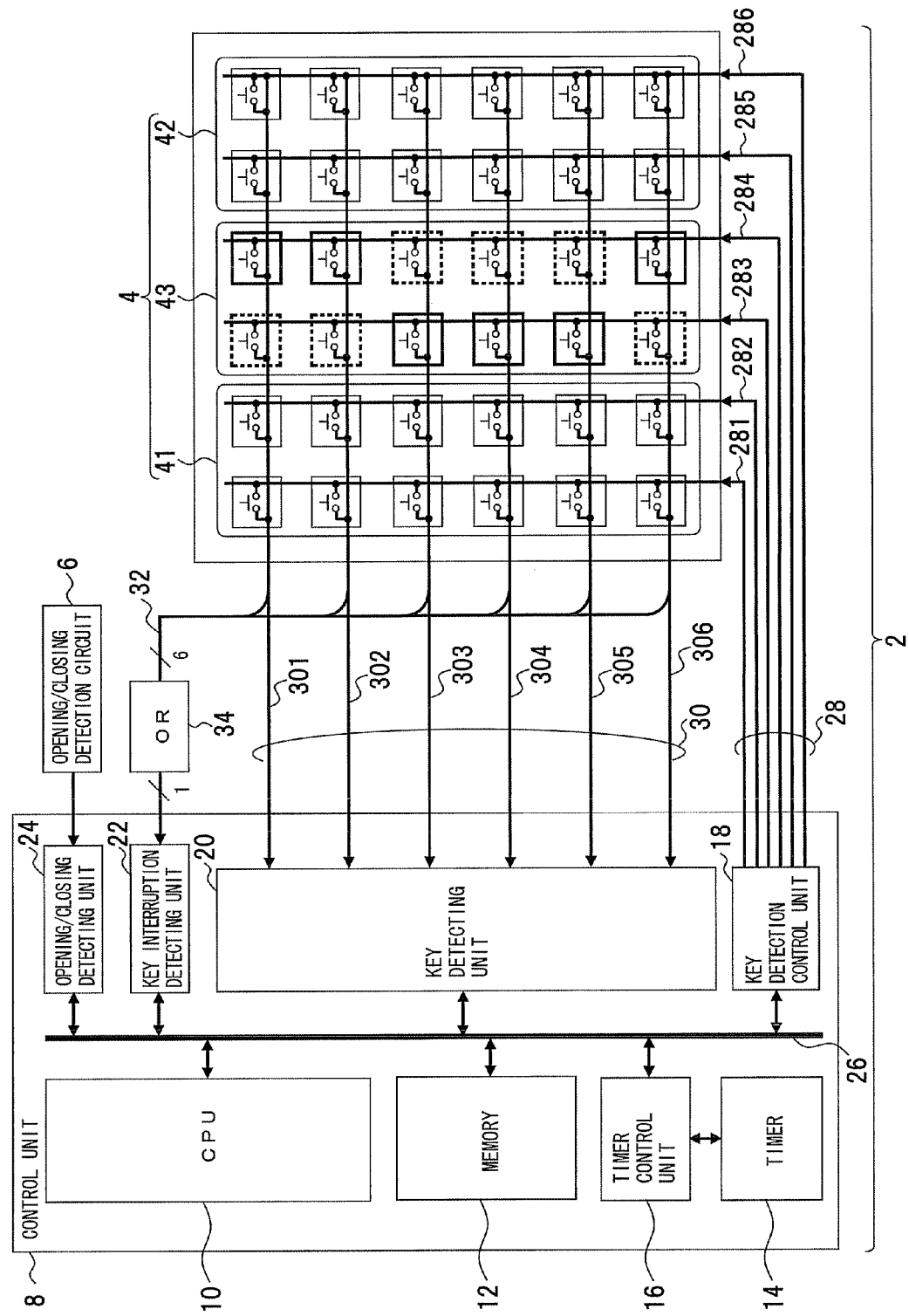
FIG. 4 depicts a portable device of a first embodiment.
Figure 5:
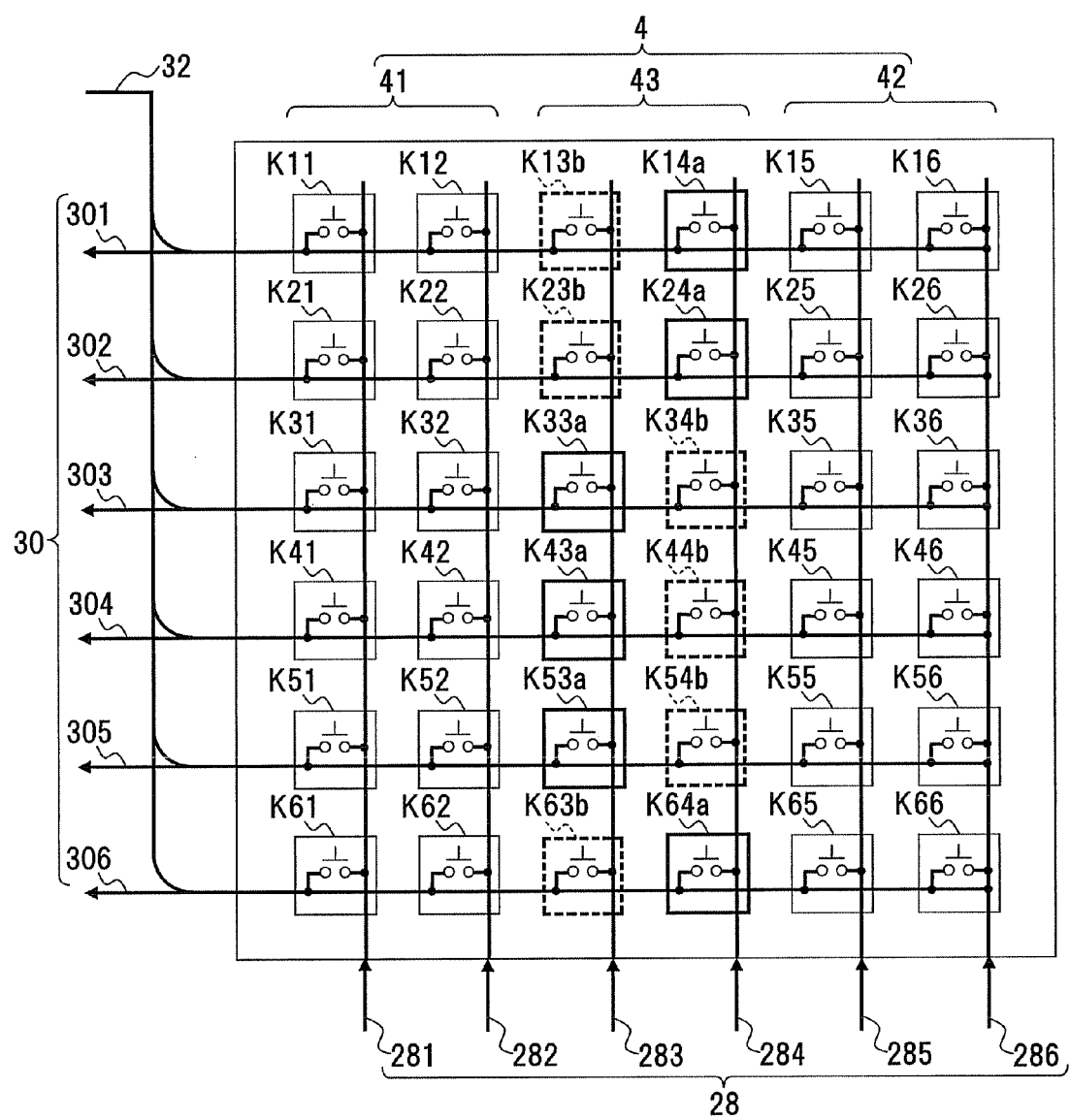
FIG. 5 depicts an example of the configuration of a key matrix circuit.
Figure 6:
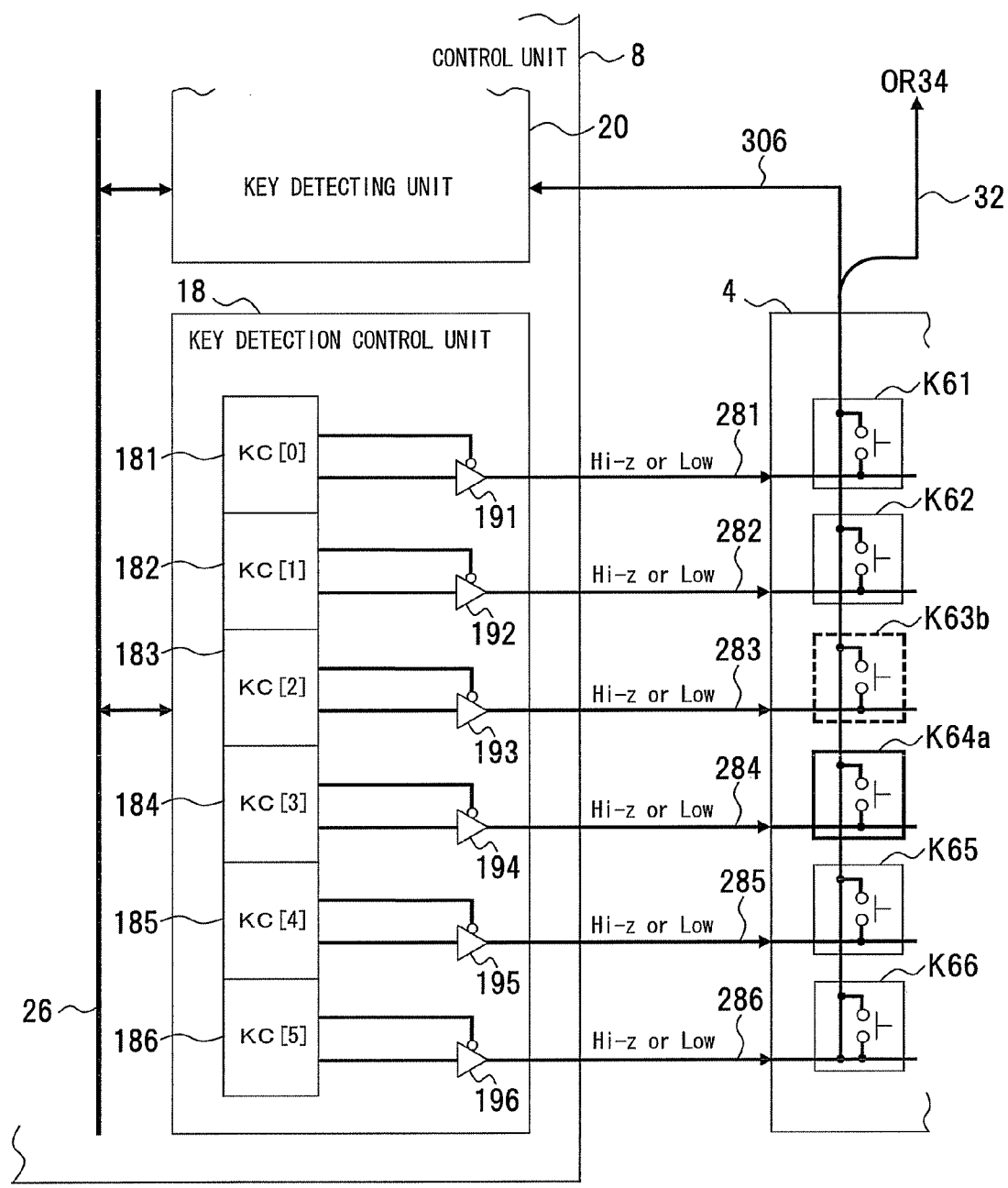
FIG. 6 depicts a configurative example of a key detection control unit.
Figure 7:
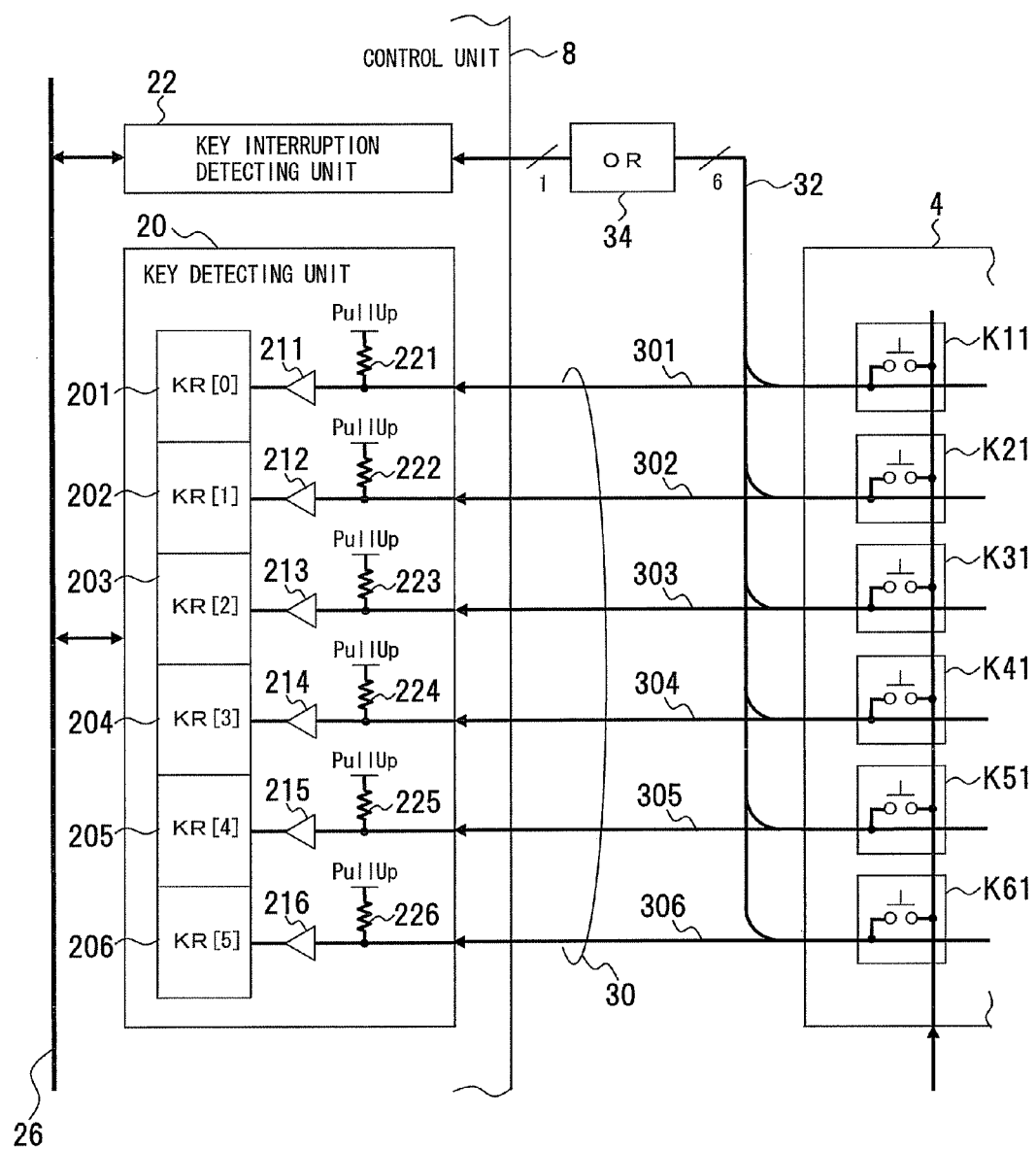
FIG. 7 depicts an example of the configuration of a key detecting unit.

FIGS. 4, 5, 6, and 7 will be referred to in describing a first embodiment of the present invention. FIG. 4 depicts an example of the configuration of a portable device of a first embodiment, FIG. 5 depicts an enlarged view of a key matrix circuit, FIG. 6 depicts an example of the configuration of a key detection control unit, and FIG. 7 depicts an example of the configuration of a key detecting unit.

The portable device 2 is an embodiment of a key control circuit, an electronic apparatus, a portable device, and a key control method of the present invention, and is provided in the form of, for example, a cellular phone that is equipped with a computer to offer a communication function and an information processing function. The portable device 2 includes a key matrix circuit 4, an opening/closing detection circuit 6, and a control unit 8.

The key matrix circuit 4 is a switch circuit that is composed of a plurality of rows and columns of keys in matrix arrangement and that identifies a pressed key. In this embodiment, the key matrix circuit 4 has a plurality of key switches K11, K12 ... K66 (FIG. 5) that are arranged in six rows and six columns. In this embodiment, the plurality of key switches K11, K12 ... K66 are classified into a plurality of key groups consisting of first, second, and third key groups 41, 42, and 43.

The key groups 41 and 42 are, for example, groups consisting of "internal keys" that are inside operation keys expected to be not used when the portable device 2 is in a closed state. "Internal keys" are the keys that are masked when the portable device 2 is in the closed state (FIG. 9), that is, the keys a press of which is enabled in the closed state. "Masking" means a state where when a key is pressed, the press of the key is ignored and therefore not detected. Such a state is electrically realized by the control unit 8. As shown in FIG. 5, the key group 41 includes key switches K11, K21 ... K61, and K12, K22 ... K62, and the key group 42 includes key switches K15, K25 ... K65, and K16, K26 ... K66.

The key group 43, for example, includes "external keys" that are outside operation keys expected to be used regardless of the closed state or opened state, such as side keys exposed out of a housing of the portable device 2 in the closed state, and part of the above "internal keys" that are included for improving the use of the key matrix circuit 4. As shown in FIG. 5, the key group 43 includes key switches K13b, K23b, K33a, K43a, K53a, and K63b, and K14a, K24a, K34b, K44b, K54b, and K64a. The key switches K14a, K24a, K33a, K43a, K53a, and K64a are external keys, and the key switches K13b, K23b, K34b, K44b, K54b, and K63b are internal keys but function as enabled keys that are detectable even if the portable device 2 is in the closed state. Specifically, the key switches K13b, K23b, and K63b are on the same line of the key switches K33a, K43a, and K53a, and, likewise, the key switches K34b, K44b, K54b are on the same line of the key switches K14a, K24a, and K64a. Different from the case of the key groups 41 and 42, therefore, the key switches K13b, K23b, K34b, K44b, K54b, and K63b are not masked so that the external keys are enabled. For this reason, in this embodiment, a polling process is started by unintended key pressing in response to the occurrence of a given condition, such as an event of the closed state, and an interval for key detection is extended by interposing a standby state of the CPU 10 to suppress power consumption.

The opening/closing detection circuit 6 is a folding detecting means that detects whether first and second housings 52 and 54 (FIG. 8) of the openable/closable portable device 2 are folded, and also is a key selecting means that selects an enabled key and a disabled key in response to an event of opening or closing of the housings 52 and 54. A detection signal from the opening/closing detection circuit 6 is taken into the control unit 8 to be used for controlling a masking process.

The control unit 8 is a controlling means having a computer, carrying out key pressing on the key matrix circuit 4 and detection of a pressed key. When the portable device 2 is in the closed state, the control unit 8 carries out the masking process of masking detection of a key in the key groups 41 and 42, detection of a key in the key group 43, the polling process in detection of a key in the key group 43, etc. The control unit 8 includes the CPU 10, a memory 12, a timer 14, a timer control unit 16, a key detection control unit 18, a key detecting unit 20, a key interruption detecting unit 22, and an opening/closing detecting unit 24. These components are connected through a bus 26. The key interruption detecting unit 22 is a first key detecting unit that detects which key is pressed when an inside operation key (internal key) or an outside operation key (external key) is pressed. The key detecting unit 20 is a second key detecting unit that detects a press of an outside operation key at regular intervals when folding of the portable device 2 is detected by the folding detecting means and a press of an inside operation key is detected.

The CPU 10 is an example of a processor executing various controls, such as key detection, masking control, and arithmetic processing, and executes a program stored on the memory 12 to control each functional unit. The memory 12 has a program memory unit, a data memory unit, a RAM (Random Access Memory), etc. The program memory unit stores an OS (Operation System) and application programs, the data memory unit stores fixed data and semiprocessed data, and the RAM constitutes a work area. The application programs include a program for determining a key to be an inside key or outside key when the portable device 2 is opened or closed, and a program for determining the number of pressed keys and whether an inside key or outside key is included in the pressed keys when two or more keys are pressed.

The timer 14 is a time counting means that counts interval time in polling. The timer 14 counts a time interval of operation of the CPU 10 and the same of stoppage of the CPU 10. The start of time counting by the timer 14 is controlled by the timer control unit 16, and when a preset predetermined time is counted, a time counting signal from the timer 14 is taken into the timer control unit 16.

The timer control unit 16 is a control means that controls the operation time of the CPU 10 to match the operation time to a predetermined time interval. The timer control unit 16 causes the timer 14 to start time counting, and takes in a time counting signal from the timer 14.

The key detection control unit 18 gives a key detection control signal to the column lines of the key matrix circuit 4 through key detection control lines 28 (consisting of six control lines 281, 282, 283, 284, 285, and 286). The key detecting unit 20 takes in a key detection signal indicating a pressed key from the row lines of the key matrix circuit 4 through key detection lines 30 (consisting of six detection lines 301, 302, 303, 304, 305, and 306). Thus, key information indicating the detected pressed key is taken into the CPU 10 in the form of the key detection signal.

The key interruption detecting unit 22 is a means that takes in a key pressing signal indicating key pressing that is sent to a matrix concentrative interruption line 32 disposed on the rows or columns of the key matrix circuit 4. The key pressing signal taken into the key interruption detecting unit 22 constitutes an event that causes detection of a pressed key. In this embodiment, since the key matrix circuit 4 is composed of six rows and six columns of keys, the matrix concentrative interruption line 32 consists of six lines. These six matrix concentrative interruption lines 32 are put together at a logical sum (OR) circuit 34, where the key pressing signal coming in through any one of the six lines is obtained.

The opening/closing detecting unit 24 is a detecting means that detects the opened/closed states of the portable device 2, as the opening/closing detection circuit 6 does, and serves also as a key selecting means. A detection signal indicating the opened state or closed state detected by the opening/closing detection circuit 6 is taken into the opening/closing detecting unit 24, and masking process control on the internal keys is executed in response to an event of this detection signal.

FIG. 6 will then be referred to in describing the key detection control unit 18. FIG. 6 is a circuit diagram of part of the portable device that includes a specific example of the configuration of the key detection control unit. In FIG. 6, the same constituent elements as described in FIGS. 4 and 5 are denoted by the same reference numerals.

In the key detection control unit 18, six key control circuits (KC) 181, 182, 183, 184, 185, and 186 are arranged in correspondence to the number of rows or columns of lines, that is, in correspondence to six key detection control lines 281, 282, 283, 284, 285, and 286. On the output portions of the KC 181, 182, 183, 184, 185, and 186, tristate circuits 191, 192, 193, 194, 195, and 196 are disposed, respectively. The tristate circuits 191, 192, 193, 194, 195, and 196 generate high-impedance output (Hi-z) or low-impedance output (Low), and generate H-z output in a normal state. The tristate circuits 191, 192, 193, 194, 195, and 196 become an Hi-z output condition when key detection is put in a masked state, while become a Low output condition in turn in increasing order and one after another when a key is detected. For example, if the key switch K61 is pressed when the tristate circuit 191 is in the Low output condition, Low output is sent to the key detecting unit 20 through the key switch K61, and the key detecting unit 20 detects the pressed key to be the key switch K61.

FIG. 7 will then be referred to in describing the key detecting unit 20. FIG. 7 is a circuit diagram of part of the portable device that includes a specific example of the configuration of the key detecting unit. In FIG. 7, the same constituent elements as described in FIGS. 4 and 5 are denoted by the same reference numerals.

In the key detecting unit 20, six status registers (KR) 201, 202, 203, 204, 205, and 206 are arranged in correspondence to the number of rows or columns of lines, that is, in correspondence to six key detection lines 301, 302, 303, 304, 305, and 306. On the input portions of the KR 201, 202, 203, 204, 205, and 206, buffer circuits 211, 212, 213, 214, 215, and 216 are disposed, respectively. The input portions of the buffer circuits 211, 212, 213, 214, 215, and 216 are connected to the positive side of a power supply via resistances 221, 222, 223, 224, 225, and 226 to be kept in a pull-up state. In this pull-up state, High input is applied to the KR 201, 202, 203, 204, 205, and 206 through the buffer circuits 211, 212, 213, 214, 215, and 216. For example, if the key switch K61 is pressed when the tristate circuit 191 (FIG. 6) is in the Low output condition, Low output is sent to the key detecting unit 20 through the key switch 61K. This changes the pull-up state into a Low state, so that the pressed key is detected to be the key switch K61. Other keys are also detected in the same manner.

When Low output is generated from the key detection control unit 18 and any one of the key switches K11, K12 . . . K66, e.g., the key switch K61 is pressed, the Low output is sent through the matrix concentrative interruption line 32 and the OR circuit 34 to the key interruption detecting unit 22, which detects an event of key pressing upon receiving the Low output.

Figure 8:
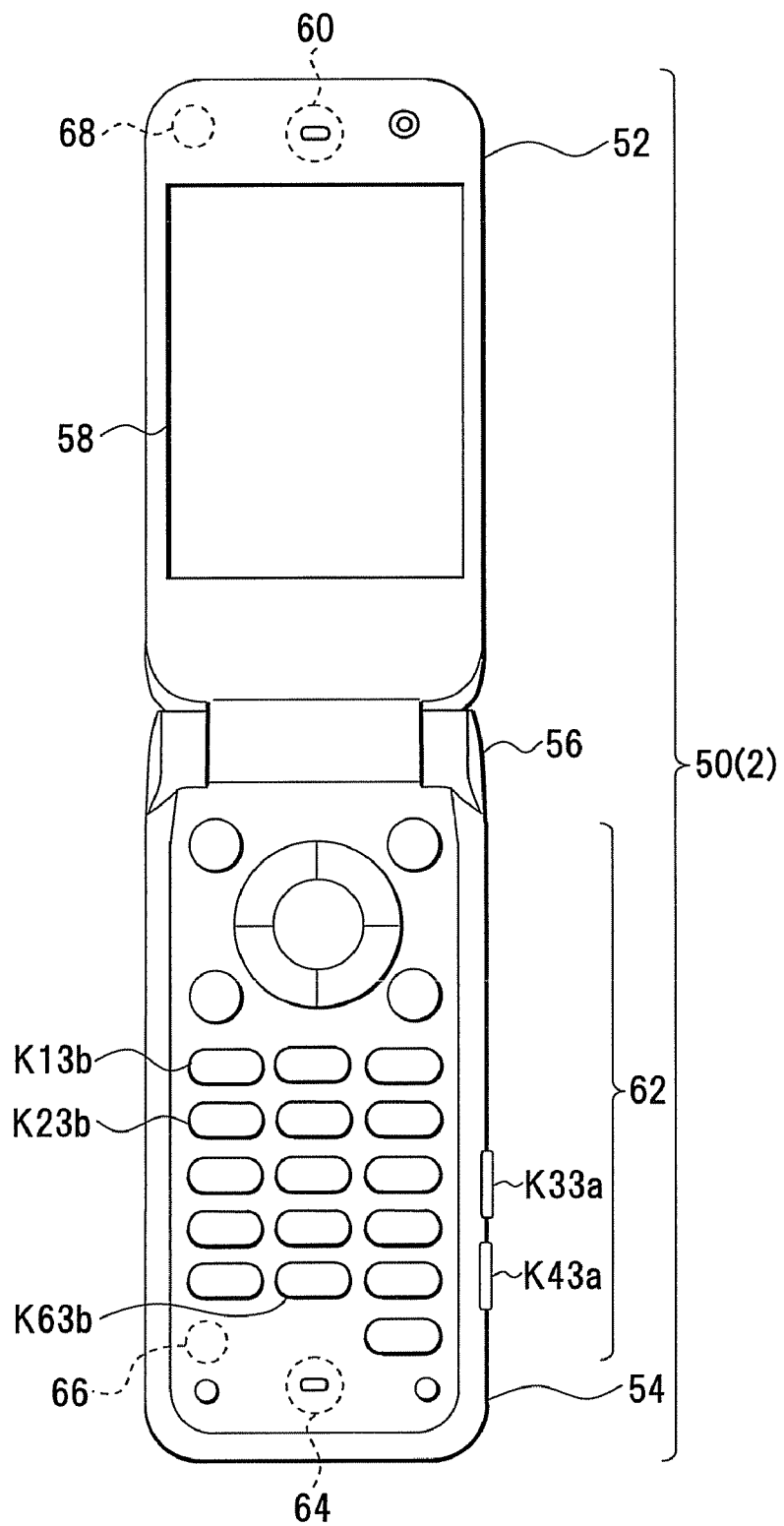
FIG. 8 depicts the foldable portable device in an opened state.
Figure 9:
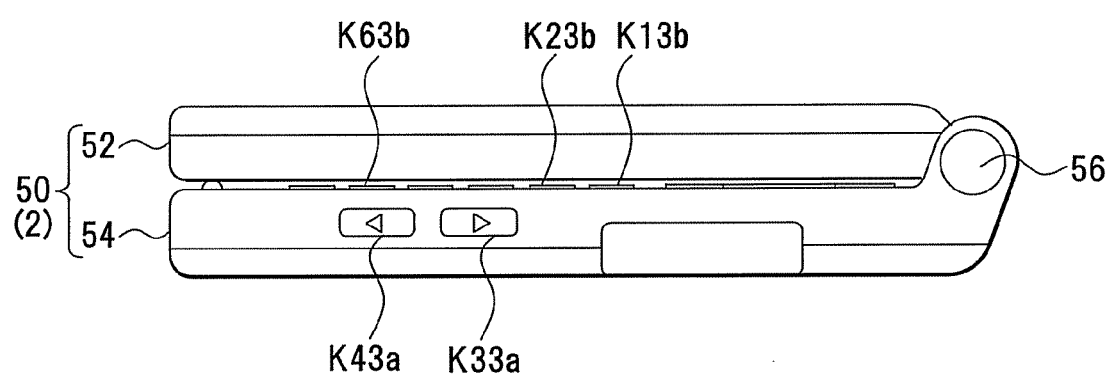
FIG. 9 depicts the foldable portable device in a closed state.

FIGS. 8 and 9 will then be referred to in describing the portable device 2. FIG. 8 is an example of the configuration of the portable device 2, showing the portable device 2 in the opened state, and FIG. 9 depicts the portable device 2 in the closed state. In FIGS. 8 and 9, the same constituent elements as described in FIGS. 4 and 5 are denoted by the same reference numerals.

The portable device 2 includes the device housing 50 composed of the first housing 52 and the second housing 54 that can be folded via a hinge 56 serving as a joining unit. The housing 52 has a display unit 58 and a receiver 60. The housing 54 has a key operation, unit 62 and a transmitter 64. The housings 52 and 54 have detection elements 68 and 66, respectively, which are connected to the opening/closing detection circuit 6. The key operation unit 62, for example, carries the above key switches K11, K12 . . . K66, thus carrying the key switches K13b, K23b, K33a, K43a, K53a, K63b, etc., included in the key group 43. The key switches K13b, K23b, K33a, K43a, K53a, and K63b that are shown on the key operation unit 62 represent an instance of key arrangement, and the arrangement of key switches is not limited to this instance.

According to this portable device 2, the housings 52 and 54 in an opened state (opened state shown in FIG. 8) can be shifted to a folded state (closed state shown in FIG. 9), and can also be shifted from the closed state to the opened state, as shown in FIGS. 8 and 9. These opened and closed states are detected by the opening/closing detection circuit 6, and a signal indicating the opened or closed state is sent through the opening/closing detecting unit 24 into the CPU 10.

Figure 10:
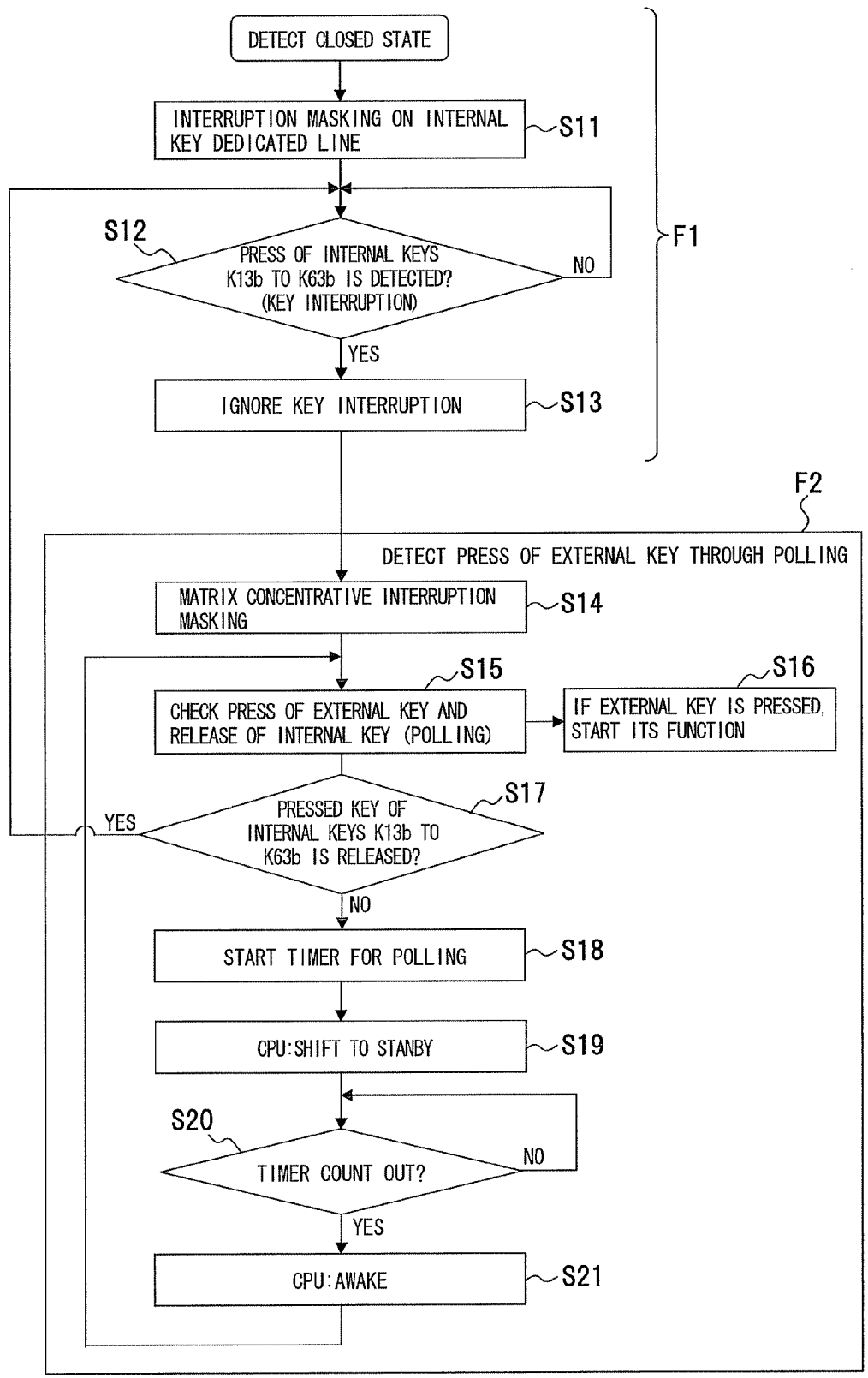
FIG. 10 is a flowchart of an example of control operation by the portable device in the closed state.
Figure 11:
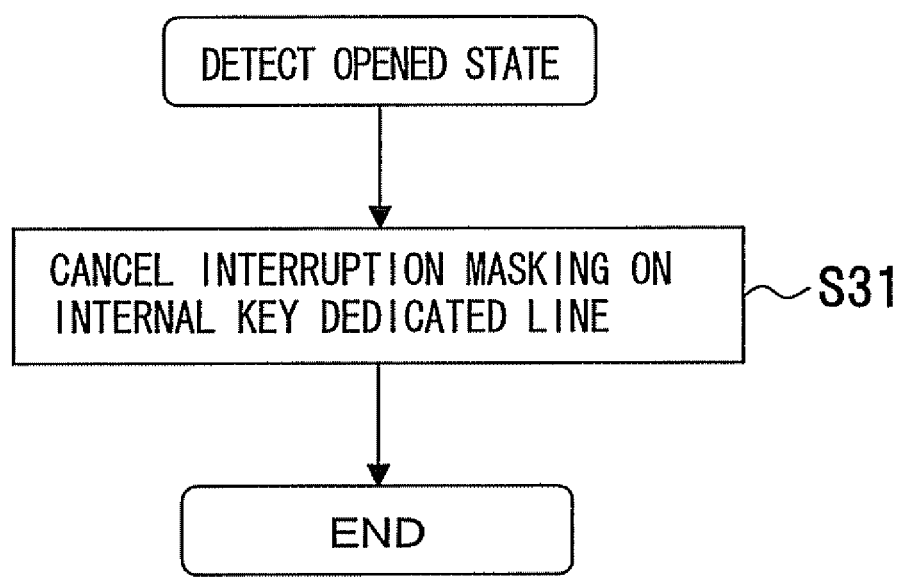
FIG. 11 is a flowchart of an example of control operation by the portable device in the opened state.

FIGS. 10 and 11 will then be referred to in describing key control depending on opening and closing of the portable device 2. FIG. 10 is a flowchart of an example of a key control method in a case of the closed state, and FIG. 11 is a flowchart of an example of a key control method in a case of the opened state.

As shown in FIG. 10, key control to carry out when the portable device 2 is in the closed state includes a step of masking control (F1) based on the closed state of the portable device 2, and a step of control (F2) based on detection of a press of an external key through polling.

In masking control (F1), when the portable device 2 is put in the closed state (FIG. 9), detection of the "closed" state by the opening/closing detection circuit 6 and the opening/closing detecting unit 24 is executed. In response to this event of detection of the closed state, interruption masking of the internal key dedicated lines is executed (step S11), which leads to execution of interruption masking that disables pressing of the key switches K11, K21 . . . K61 and K12, K22 . . . K62, and the key switches K15, K25 . . . K65 and K16, K26 . . . K66 (FIG. 5) that belong to the key group 41, and the key group 42 (FIG. 4).

When foreign matter comes in between the housing 52 and the housing 54 of the portable device 2 in the closed state (FIG. 9) to cause detection of unintended pressing (key interruption) of one or two or more of the key switches K13b, K23b, K34b, K44b, K54b, and K63b (FIG. 5)(step S12), no function is assigned to a pressed key among these key switches K13b, K23b, K34b, K44b, K54b, and K63b that are not expected to be pressed when the portable device 2 is in the closed state, so that key interruption on the key switches K13b, K23b, K34b, K44b, K54b, and K63b is ignored (step S13). In this case, key interruption is ignored because the portable device 2 is in the "closed" state, and a function assigned to the pressed key is not activated.

These key switches K13b, K23b, K34b, K44b, K54b, and K63b, however, are on the same line of the external keys a press of which is enabled, so that pressing detection on the key switches K13b, K23b, K34b, K44b, K54b, and K63b is not ignored. This leads to searching operation by the CPU 10, which increases power consumption. To prevent this, detection of external key pressing through polling, which is the next step (F2), is executed.

At this step (F2), as one or two or more of the internal key switches K13b, K23b, K34b, K44b, K54b, and K63b are pressed continuously, input from the matrix concentrative interruption line is ignored to disable detection of a press of an external key. External key detection, however, is necessary even when the portable device 2 is in the "closed" state, so that external key detection is carried out through polling executed at regular intervals. In this case, the release of a pressed internal key results in canceling of the polling sequence.

At this step (F2), since the portable device 2 is in the closed state, the key interruption detecting unit 22 stops its detection function under matrix concentrative interruption masking even if any one of the key switches belonging to the key group 43 is pressed, and the CPU 10 executes control to ignore the key pressing. In this situation, in response to an event of a press of one or two or more of the key switches K13b, K23b, K34b, K44b, K54b, and K63b, control by the CPU 10 is changed to control for executing periodical key detection so as to reduce power consumption due to the continuous press of the key.

Following matrix concentrative interruption masking (step S14), check (polling) is performed on pressing of an external key and on the release of pressing of any one of the internal keys, i.e., pressing of any one of the key switches K13b, K23b, K34b, K44b, K54b, and K63b that is an event causing transition to polling control (step S15). If any one of the external keys expected be pressed, i.e., any one of the key switches K14a, K24a, K33a, K43a, K53a, and K64a is pressed, a function to start in response to an event of the key pressing is started (step S16).

In this case, when one or two or more of the key switches K13b, K23b, K34b, K44b, K54b, and K63b is pressed, or pressing of one or two or more of the key switches K13b, K23b, K34b, K44b, K54b, and K63b is involved in pressing of an external key, whether the key pressing is released is determined (step S17). If the key pressing is released (YES at step S17), the process flow returns to step S12, where the CPU 10 becomes a standby status.

In contrast, if the key pressing is not released (NO at step S17), the timer 14 for polling is started in response to an event of pressing of one or two or more of the key switches K13b, K23b, K34b, K44b, K54b, and K63b (step S18). In this case, instantaneous pressing and releasing of the key switches K13b, K23b, K34b, K44b, K54b, and K63b does not require the start of the timer 14.

When the timer 14 starts, the CPU 10 changes in status to the standby status in synchronization with the start of the timer 14 (step S19), and the timer 14 continues time counting. The timer 14, in counting a preset predetermined time, continues time counting until the preset predetermined time has passed, and whether the timer 14 has counted out, that is, whether the predetermined time has passed is determined (step S20). The CPU 10, which is kept in the standby status during time counting by the timer 14, returns to an awake status based on a time counting signal output from the timer 14 (step S21). The process flow then returns to step S15, at which key pressing detection is resumed.

In this manner, the CPU 10 remains in the standby status during the predetermined time. This significantly reduces current consumption compared to a case where the CPU 10 is kept in the awake status to continuously detect key pressing. The current consumption is reduced according to a time span in which the CPU 10 remains in the standby status and a time span in which the CPU 10 having returned from the standby status remains in the awake status.

In key control to carry out when the portable device 2 is in the opened state, interruption masking on the internal key dedicated lines to carry out in the closed state is canceled, as shown in FIG. 11. In control for this case, when the portable device 2 is put in the opened state (FIG. 8), detection of the "opened" state by the opening/closing detection circuit 6 and the opening/closing detecting unit 24 is executed, and, in response to an event of detection of the opened state, interruption masking on the internal key dedicated lines is canceled (step S31) to execute normal key detection.

Figure 12:
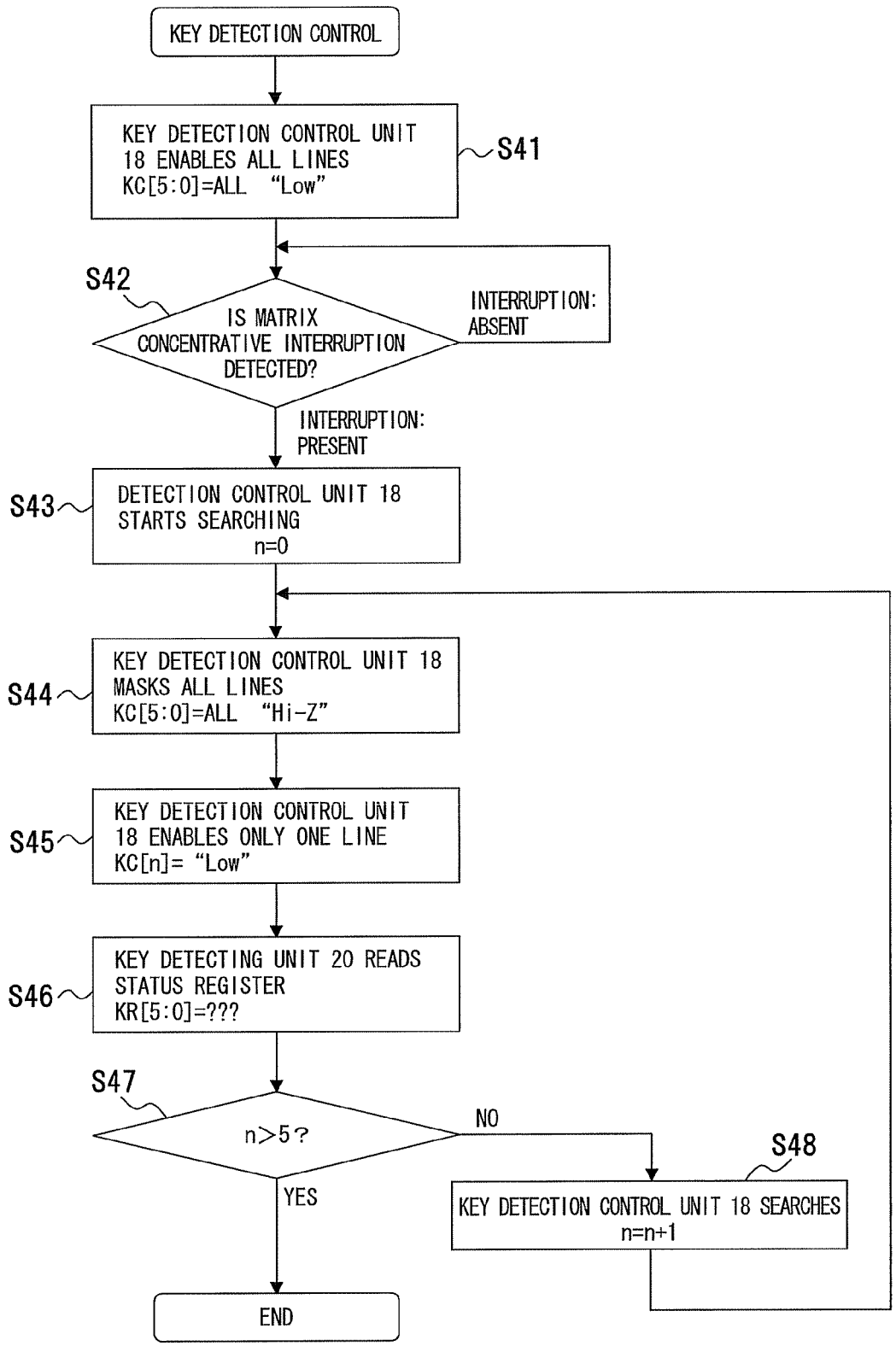
FIG. 12 is a flowchart of key detection control.

FIG. 12 will then be referred to in describing key detection. FIG. 12 is a flowchart of an example of a key detection method for detecting a pressed key.

In this key detection, the key detection control unit 18 enables all lines to put the KC181, KC182 . . . KC186 in the Low output condition (step S41). In this condition, detection of matrix concentrative interruption is carried out (step S42), and a standby status for waiting key pressing follows until a press of any one of the key switches K11, K21 . . . K66 happens. When any one of the key switches K11, K21 . . . K66 is pressed, "interruption" is recognized.

At this time, the key detection control unit 18 starts searching (n=0 at step S43), and masks all lines in response to an event of key pressing, which means every output from the KC181, KC182 . . . KC186 is temporarily turned into Hi-z output (step S44). The key detection control unit 18 then enables only one line of the key matrix circuit 4. Specifically, every output from the KC181, KC182 . . . KC186 is changed in turn to Low output consecutively (step S45), and the key detecting unit 20 reads output from the KR201, KR202 . . . KR206 (step S46).

In this embodiment, the number of line N for key detection is given as N=6, so that key detection control is executed continuously until the number of lines subjected to key detection reaches N=6 (in this case n=0 to 5). In other words, whether n>5 is satisfied is determined (step S47), and the key detection control unit 18 continues the search (n=n+1) until the number of lines reaches N=6 (step S48). When n>5 is satisfied, therefore, detection of a pressed key is ended.

In this key detection, a pressed key is identified when Low output from any one of the KC181, KC182 . . . KC186 and Low output from any one of the key detection lines 301 to 306 resulting from key pressing are effective at the same time, and the identified pressed key is the result of key detection.

Figure 13:
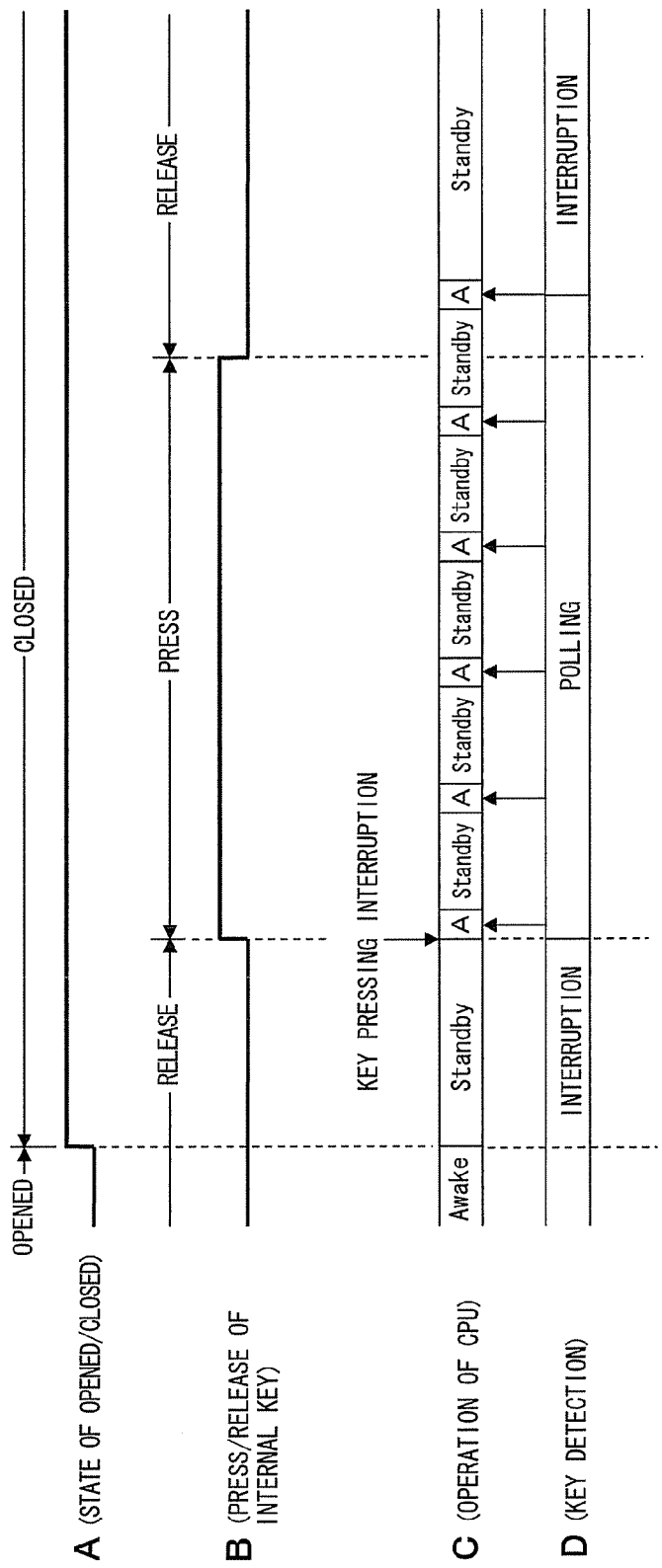
FIG. 13 is a timing chart of an example of control operation by the portable device.
Figure 14:
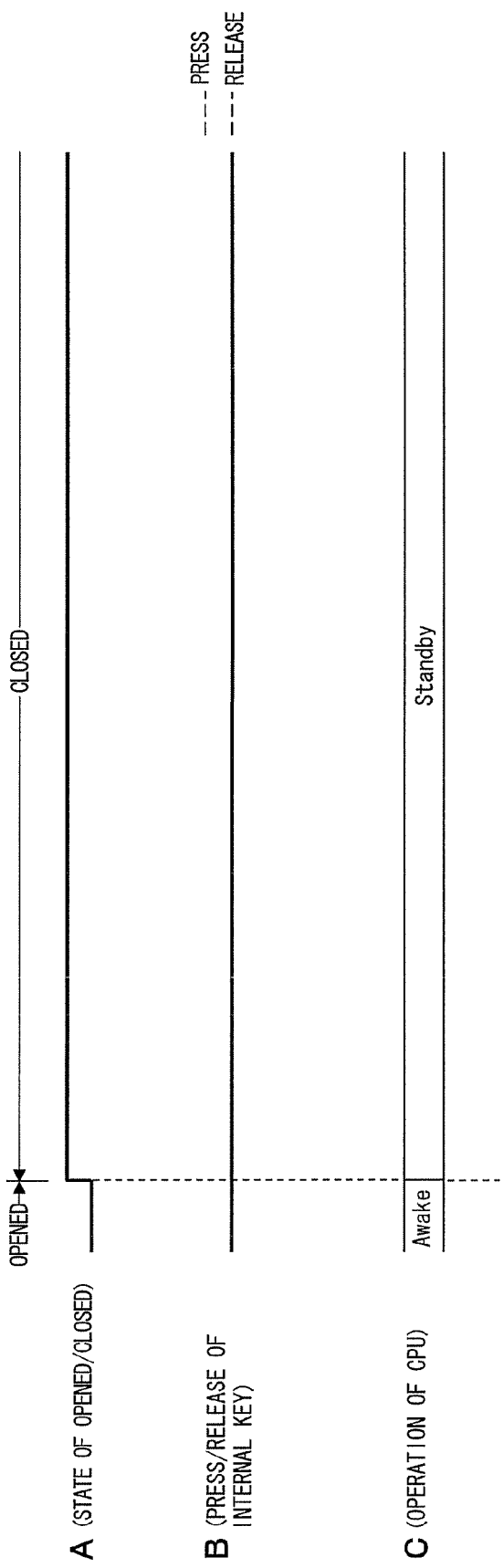
FIG. 14 is a timing chart of an example of control operation by the portable device.

FIGS. 13 and 14 will then be referred to in describing key detection control. FIG. 13 is a timing chart indicating key control accompanied with a polling operation, and FIG. 14 is a timing chart indicating key control not accompanied with the polling operation (standby status).

In FIG. 13, A indicates a change in the state of the portable device 2 from the opened state to the closed state, and "opened" represents the opened state while "closed" represents the closed state. B indicates an action that, in the closed state, any one of the unpressed key switches K13b, K23b, K34b, K44b, K54b, and K63b serving as internal keys is pressed to become a pressed state and is released from the pressed state.

A press of an internal key leads to the start of key pressing interruption. This causes the CPU 10 to repeat the awake status and the standby status at regular intervals, as C indicates. As D indicates, the status of key detection changes from an interruption status to a polling status, in which pressing of an external key and releasing of an internal key is detected by polling in a time span during which the CPU 10 is in the awake status.

In this manner, the periodical status change of the CPU 10 to the standby status suppresses current consumption by the CPU 10. When the release of an internal key is detected in polling, key detection changes over to an interruption detection status and the CPU 10 returns to the standby status.

In the above manner, when an internal key is pressed in the closed state, the CPU 10 becomes the awake status to consume as much current as consumed in normal operation during the continuation of key pressing. This current consumption by the CPU 10, however, is suppressed through the operation as described above.

When the portable device 2 changes from the opened state to the closed state, as shown in FIG. 14A, and if no internal key is pressed in the closed state, as shown in FIG. 14B, the portable device 2 carries out normal operation in the closed state. In the normal operation, the CPU 10 maintains its standby status, as shown in FIG. 14C, which results in no unnecessary current consumption.

When a key is pressed when the portable device 2 is in the closed state, a determination whether the key is an internal key or an external key is carried out through a program-based process by the CPU 10. When the key is determined to be an external key, normal key pressing detection follows. When the key is determined to be an internal key, the polling operation follows for releasing the key. If an internal key and an external key are pressed simultaneously, priority is given to the polling operation, by which the release of the internal key is detected.

Figure 15:
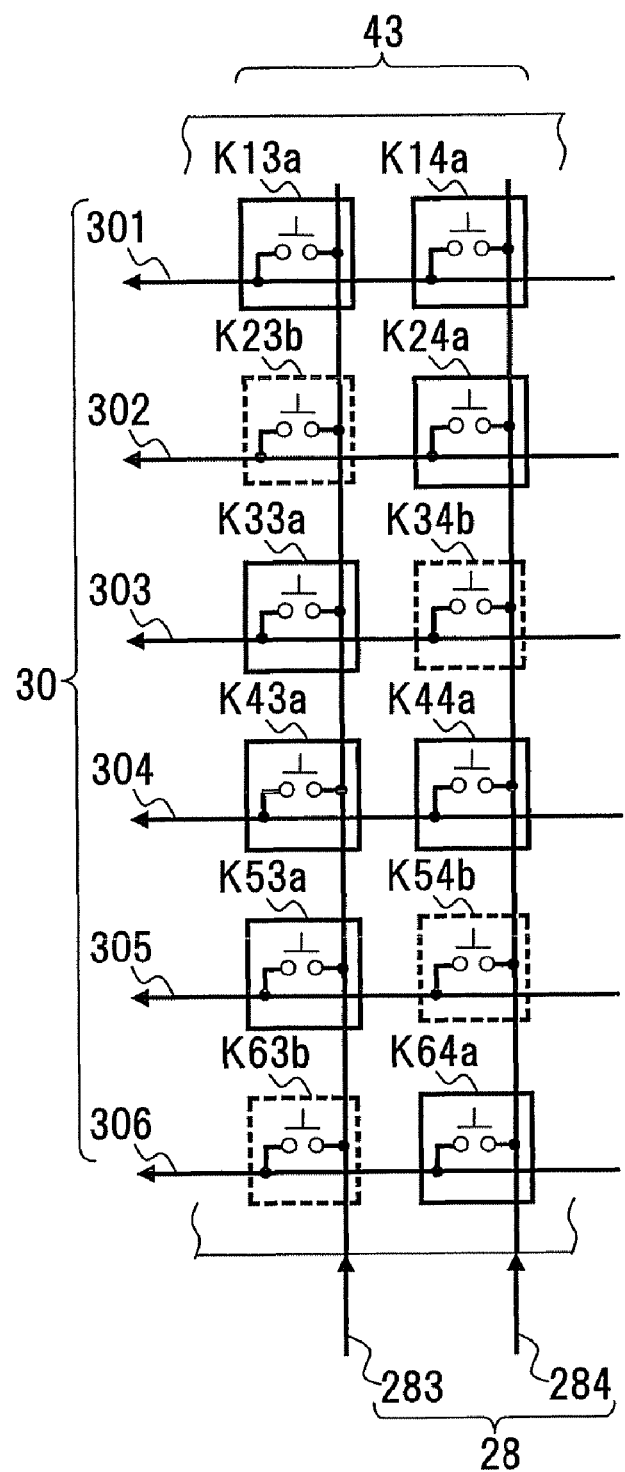
FIG. 15 depicts another example of the configuration of a key group of the key matrix circuit.

FIG. 15 will then be refereed to in describing the key group 43. FIG. 15 depicts a variant of the arrangement of internal keys and external keys. In the above embodiment, the key switches K14a, K24a, K33a, K43a, K53a, and K64a are set as external keys, and the key switches K13b, K23b, K34b, K44b, K54b, and K63b are set as internal keys in the key group 43. This key arrangement may be modified in such a way that the key switches K13a, K14a, K24a, K33a, K43a, K44a, K53a, and K64a are set as external keys, and the key switches K23b, K34b, K54b, and K63b are set as internal keys, as shown in FIG. 15.

In the first embodiment, when internal keys and external keys are situated together on the same line in the key matrix circuit 4, matrix concentrative interruption is masked in response to an event of pressing of an internal key after the "close" of the portable device 2, and the operation sequence is changed to a sequence of detecting a press of an external key through soft polling.

Then, in response to an event of detection of the "closed" state by the opening/closing detecting unit 24 of the portable device 2, all the lines in the key matrix circuit 4 excluding the lines including external keys are masked. When an internal key on the line including external keys is pressed continuously while the closed state is maintained, which is, for example, a case where a user presses the key unintentionally by pasting a seal, etc., the interruption status continues to avoid a situation where the external keys on the line cannot be detected by interruption. In other words, detection of an external key is still necessary even in such a masked situation, so that pressing of the external key is detected through soft polling carried out at regular intervals. In polling, keeping the CPU 10 in the constant awake status results in greater current consumption. For this reason, the CPU 10 is changed in status to the standby status at the point that a minimum necessary process in polling is over. In this manner, soft operation (polling scan) is executed as the operation of repeating the awake status (polling) and the standby status at the regular intervals.

In this polling scan, detection of the release of the internal key on the line including external keys causes the polling scan to stop, which resumes the normal detection status for standing by for interruption. Hence power consumption is reduced as key detection is executed.

Second Embodiment

Figure 16:
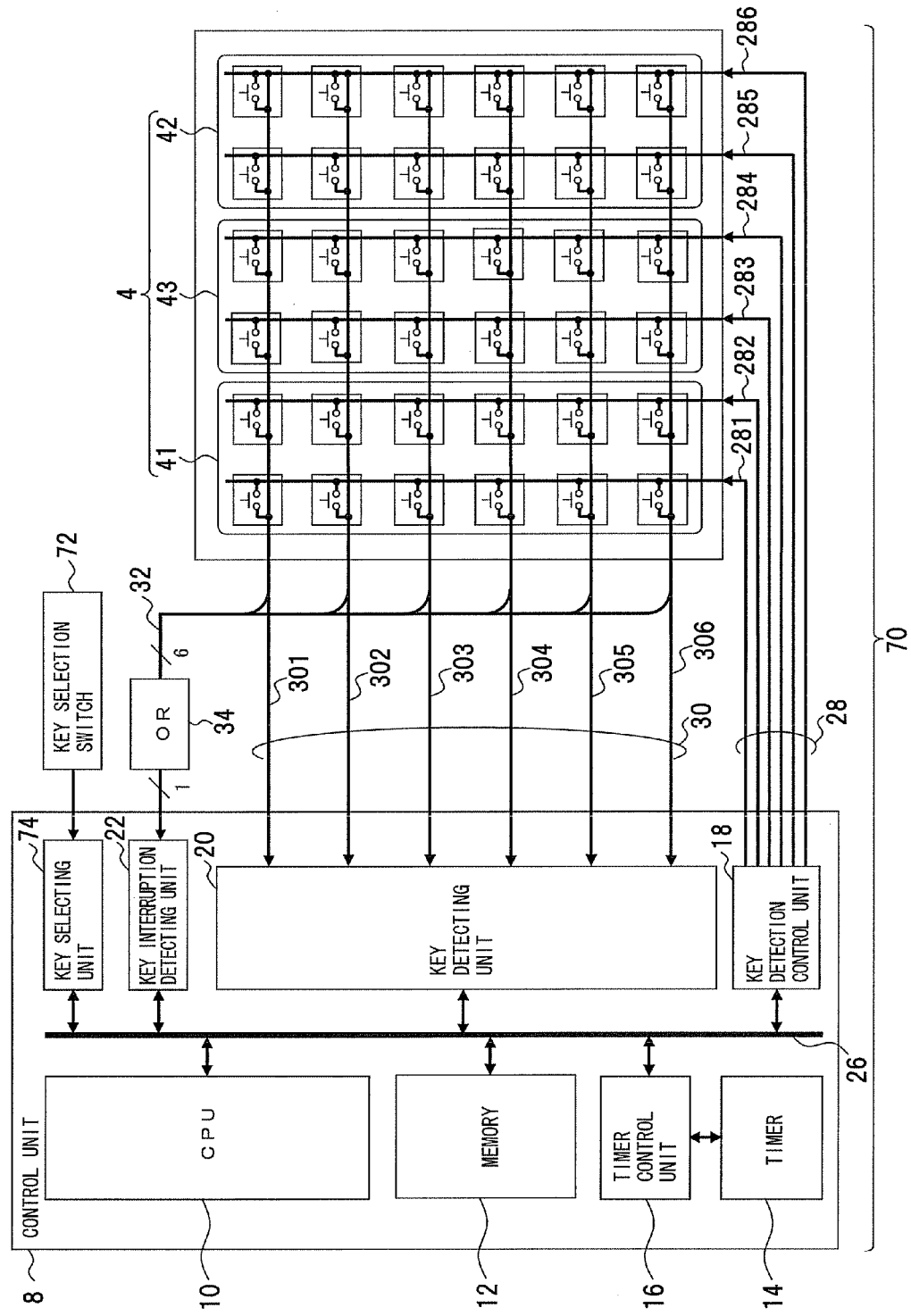
FIG. 16 depicts a key control circuit of a second embodiment.

FIG. 16 will then be referred to in describing a second embodiment of the present invention. FIG. 16 depicts an example of a key control circuit of the second embodiment. In FIG. 16, the same constituent elements as described in FIG. 4 are denoted by the same reference numerals.

In the first embodiment, when the portable device 2 is in the closed state, the key pressing function of keys in the key groups 41 and 42 is masked as key pressing detection is made possible for the key switches K14a, K24a, K33a, K43a, K53a, and K64a, which are the external keys belonging to the key group 43, and the key switches K13b, K23b, K34b, K44b, K54b, and K63b, which are the internal keys belonging to the key group 43. Thus, polling is executed in response to an event of pressing of any one of the key switches K13b, K23b, K34b, K44b, K54b, and K63b belonging to the key group 43, and key pressing is detected at regular intervals.

In the second embodiment, any one of or all of key groups 41, 42, and 43 are selected as enabled keys, and, for the enabled keys, detection of key pressing or of a pressed key is carried out at regular intervals by executing polling as described above. Such key selection and searching of key pressing and of a pressed key allow a key matrix circuit 4 having a plurality of keys to meet a demand for such variation as various functional selections through key selection and interval control in pressing detection.

A key control circuit 70 includes a key selection switch 72 composed of switches, etc., as shown in FIG. 16, and selected input from this key selection switch 72 is taken into a key selecting unit 74 of a control unit 8. In this key selection, for example, the key group 43 is selected out of a plurality of the key groups 41, 42, and 43 of the key matrix circuit 4. Before key selection, pressing detection for the key switches in the key groups 41, 42, and 43 is allowed, and, after selection of the key group 43, the key groups 41 and 42 are put in a masked state in which detection of a press of a key switch belonging to the key groups 41 and 42 is ignored. Thus, key pressing detection and polling are executed for only the key group 43. This key selection is carried out not only in the form of collective selection from the key groups 41, 42, and 43, but may be carried out in the form of selection of key switches line by line.

In this case, the above polling is started by a specific key that is selected from the key switches K13a, K23a ... K63a and K14a, K24a ... K64a that belong to the selected key group 43.

Other Embodiments

The present invention is not limited to the above embodiments, but includes the following other embodiments.

Figure 17:
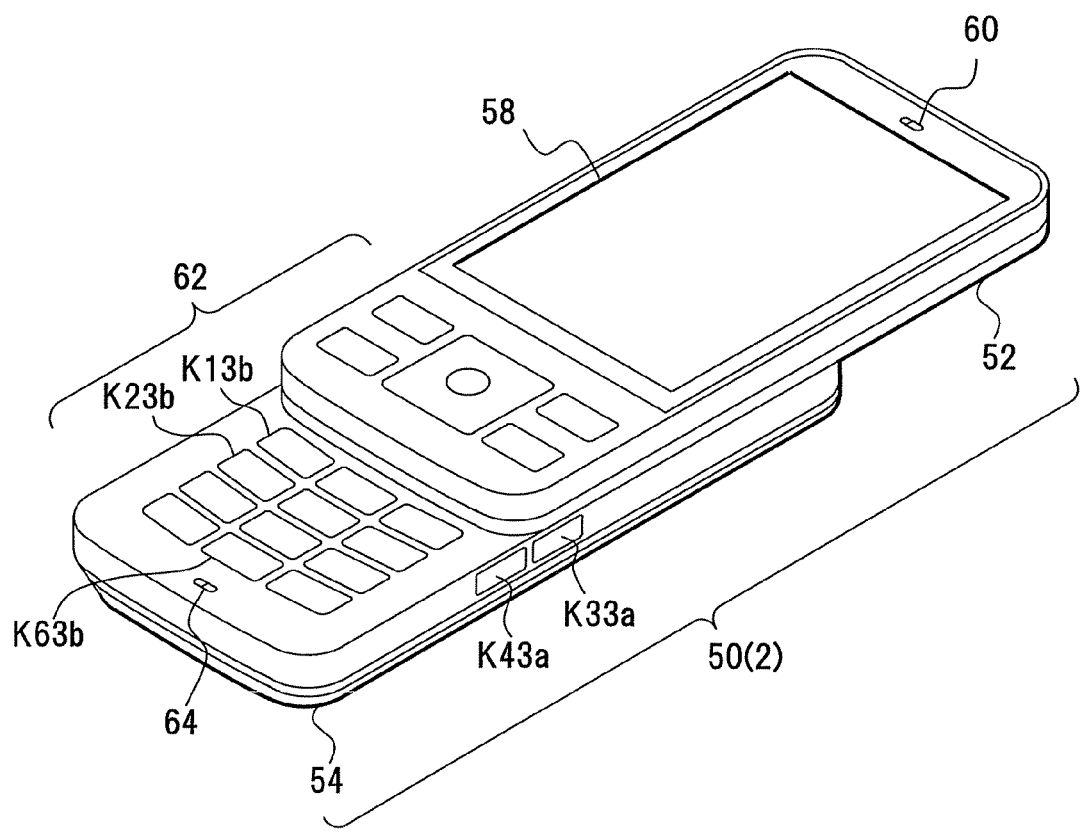
FIG. 17 depicts a portable device of another embodiment.

(1) While the portable device 2 having foldable housings is described as an example in the above embodiments, the present invention is not limited to the foldable portable device 2. The present invention may apply to, for example, a portable device including slidable housings. FIG. 17 depicts an example of a slidable portable device. As shown in FIG. 17, a device housing 50 of a portable device 2 includes two housings 52 and 54, which are configured to be slidable. The housing 54 has internal keys concealed by the housing 52, which internal keys include key switches K13b, K23b, K63b, etc., that are on the same line of external keys on the key matrix circuit 4 (FIG. 5). In this manner, the slidable portable device 2 is configured in the same way as in the first embodiment so that the release of an unintentionally pressed internal key is detected through polling to reduce current consumption by a CPU 10.

Figure 18:
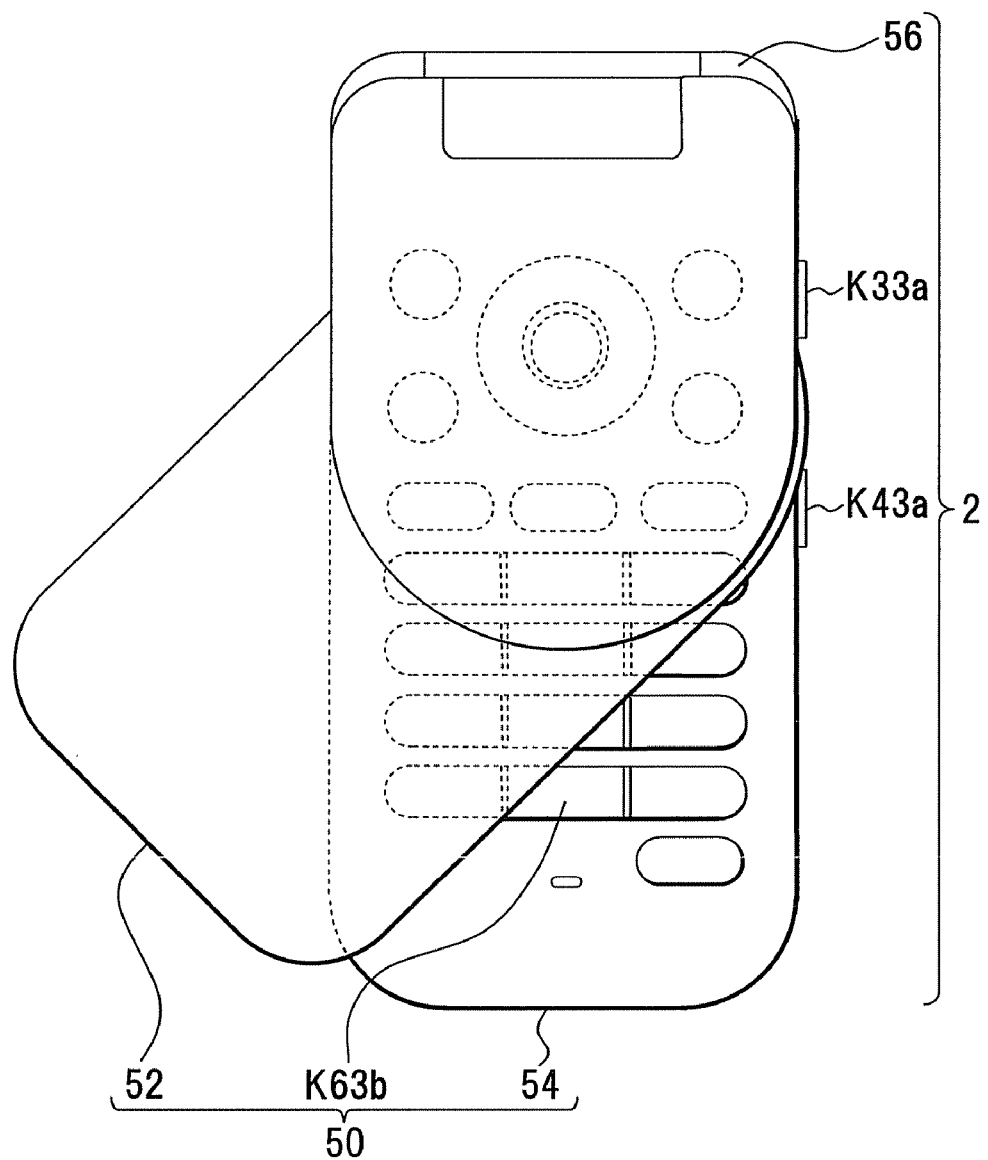
FIG. 18 depicts a portable device of still another embodiment.

(2) The present invention may apply to a portable device including foldable housings one of which can be laterally rotated. FIG. 18 depicts an example of a portable device including a device housing allowing folding and lateral rotation. As shown in FIG. 18, a device housing 50 of a portable device 2 has the housings 52 and 54 that can be folded via a hinge 56, and the housings 52 is capable of lateral rotation when in a folded state. FIG. 18 shows the housings 52 in a rotated state. The housing 54 has internal keys concealed by the housing 52, which internal keys include key switches K63b, etc., that are on the same line of external keys on the key matrix circuit 4 (FIG. 5). In this manner, this rotatable portable device 2 is configured in the same way as in the first embodiment so that the release of an unintentionally pressed internal key is detected through polling to reduce current consumption by a CPU 10.

Figure 19:
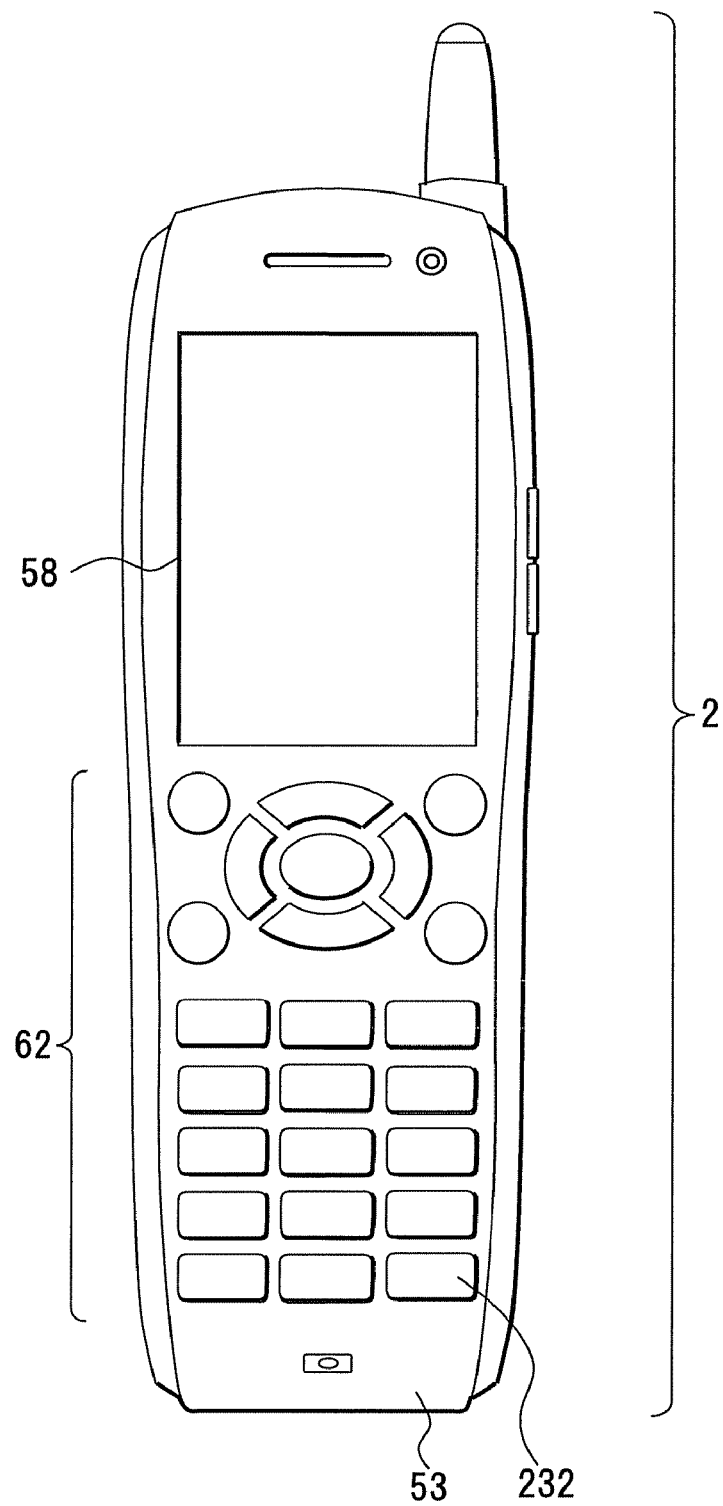
FIG. 19 depicts a portable device of still another embodiment.

(3) The present invention may apply to a flat portable device including a single housing. FIG. 19 depicts an example of a flat portable device. As shown in FIG. 19, this portable device 2 includes a single housing 53, which has a display portion 58, a key operation unit 62, etc. In this case, as explained in the second embodiment, the key operation unit 62 is provided with a key selection switch 232 to allow key selection for determining whether key pressing is enabled or disabled out of a plurality of key switches. This reduces current consumption by a CPU 10, which results from unintended key pressing on the key operation unit 62, through polling operation for key releasing.

Figure 20:
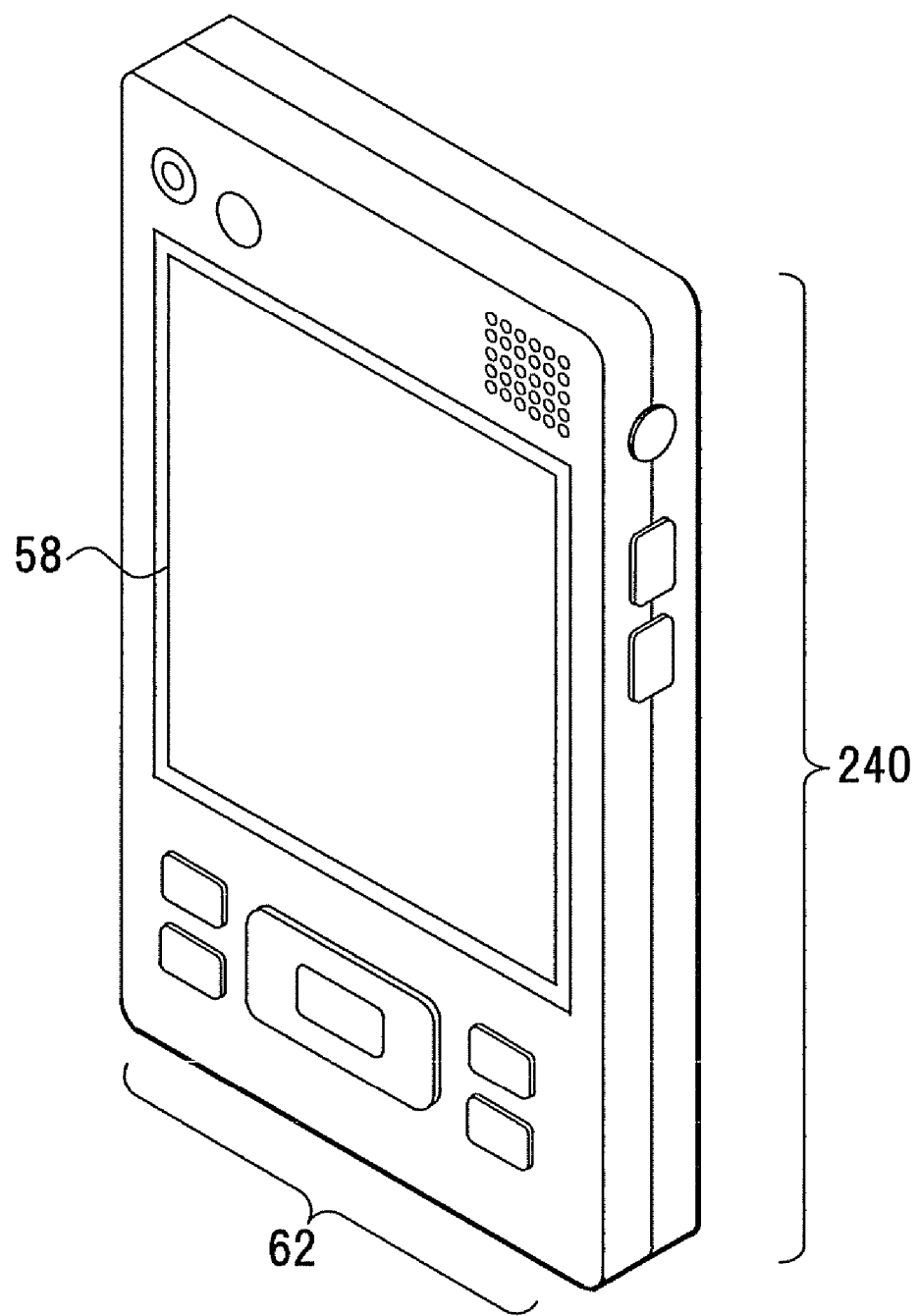
FIG. 20 depicts a PDA of still another embodiment.
Figure 21:
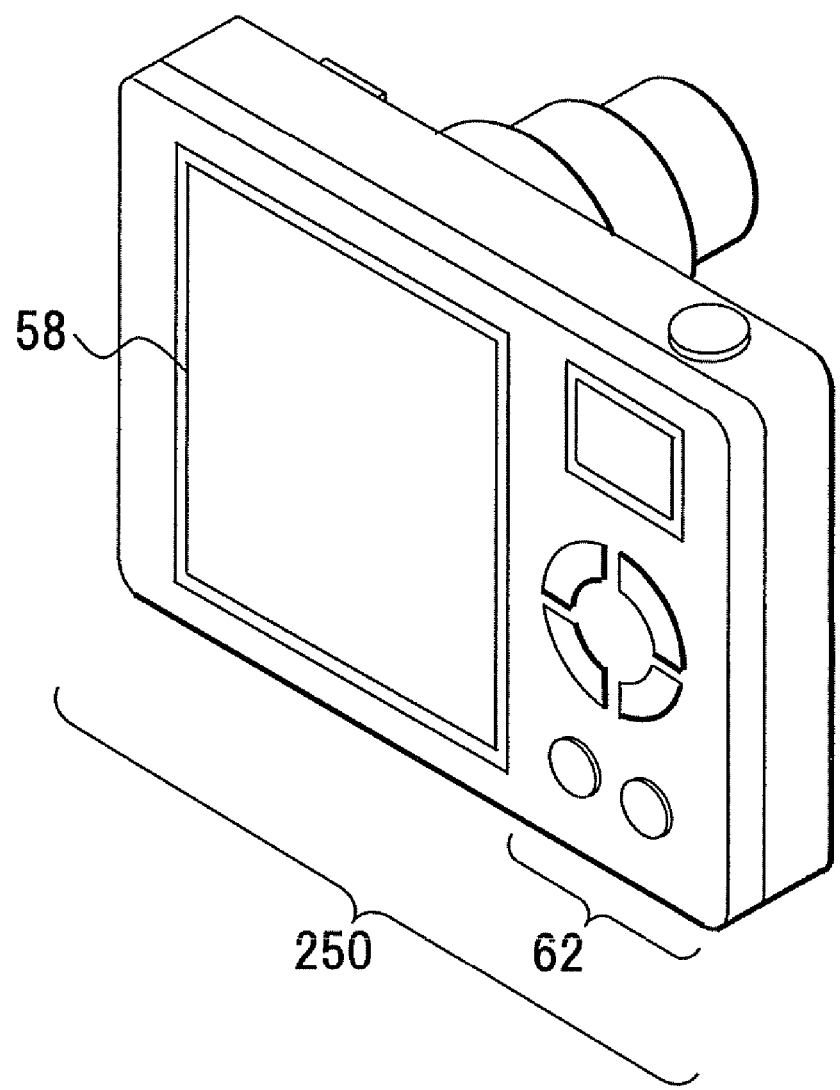
FIG. 21 depicts a digital camera of still another embodiment.

(4) While a cellular phone is presented as an example of the portable device 2 in the above embodiments, the present invention may apply to an electronic apparatus such as a portable information terminal (PDA: Personal Digital Assistant) 240 shown in FIG. 20, a digital camera shown in FIG. 21, and a personal computer (PC), which is not shown. In FIGS.

20 and 21, the same constituent elements as described in FIG. 8 are denoted by the same reference numerals, and are not described further.

While the most preferred embodiments of the present invention have been described hereinabove, the present invention is not limited to the above embodiments, and it is a matter of course that various variations and modifications can be made by those skilled in the art within the scope of the claims without departing from the spirit of the invention disclosed herein, and needless to say, such variations and modifications are also encompassed in the scope of the present invention.

The present invention relates to a key control circuit, an electronic apparatus, a portable device, and a key control method. According to the present invention, power consumption resulting from detection of an unintended press of a key to be excluded from the subject of key detection among a plurality of enabled keys can be reduced after key selection, and detection of a press of a specific key included in the enabled keys is differentiated in process from detection of the same carried out before key selection. This lowers a search time density in key searching to reduce power consumption. Also, additional use of key selection from a key matrix circuit having a plurality of keys offers an advantage of an improvement in a variation function for key operation and key pressing. With these advantages, the present invention is useful.

What is claimed is:

1. A key control circuit controlling a key matrix circuit in which keys are arranged in a plurality of rows and columns, comprising:
   a key selecting means making the keys disabling or enabling by either line of the rows or the columns on the key matrix circuit being used as a unit; and
   a control means, when key selection is performed by the key selecting means, detecting a press of an enabled key, keeping key pressing detection in a standby status for a predetermined time from a time point of the press of the enabled key, and resuming the key pressing detection after passage of the predetermined time to check a press of an enabled key to which a function is assigned,
   wherein the control means starts the function which is assigned, if the enabled key to which the function is assigned is pressed, and
   the control means keeps the key pressing detection in the standby status, if the enabled key to which the function is assigned is not pressed and a press of an enabled key to which the function is not assigned is not released.

2. The key control circuit of claim 1, wherein
   the control means detects a pressed key in response to an event of a press of the key on the key matrix circuit when the key selection is not performed by the key selecting means, and detects a pressed key in response to an event of a press of the enabled key when the key selection is performed by the key selecting means.

3. The key control circuit of claim 1, further comprising a time counting means starting time counting in response to an event of a press of the enabled key and outputting a time counting signal indicating passage of a predetermined time when the predetermined time has passed from the start of time counting.

4. An electronic apparatus having a key matrix circuit in which keys are arranged in a plurality of rows and columns, comprising:
   a key selecting means making the keys disabling or enabling by either line of the rows or the columns on the key matrix circuit being used as a unit; and
   a control means, when key selection is performed by the key selecting means, detecting a press of an enabled key, keeping key pressing detection in a standby status for a predetermined time from a time point of the press of the enabled key, and resuming the key pressing detection after passage of the predetermined time to check a press of an enabled key to which a function is assigned,
   wherein the control means starts the function which is assigned, if the enabled key to which the function is assigned is pressed, and
   the control means keeps the key pressing detection in the standby status, if the enabled key to which the function is assigned is not pressed and a press of an enabled key to which the function is not assigned is not released.

5. The electronic apparatus of claim 4, wherein
   the control means detects a pressed key in response to an event of a press of the key on the key matrix circuit when the key selection is not performed by the key selecting means, and detects a pressed key in response to an event of a press of the enabled key when the key selection is performed by the key selecting means.

6. The electronic apparatus of claim 4, further comprising a time counting means starting time counting in response to an event of a press of the enabled key and outputting a time counting signal indicating passage of a predetermined time when the predetermined time has passed from the start of time counting.

7. A portable device having a key matrix circuit in which keys are arranged in a plurality of rows and columns, comprising:
   a key selecting means making the keys disabling or enabling by either line of the rows or the columns on the key matrix circuit being used as a unit; and
   a control means, when key selection is performed by the key selecting means, detecting a press of an enabled key, keeping key pressing detection in a standby status for a predetermined time from a time point of the press of the enabled key, and resuming the key pressing detection after passage of the predetermined time to check a press of an enabled key to which a function is assigned,
   wherein the control means starts the function which is assigned, if the enabled key to which the function is assigned is pressed, and
   the control means keeps the key pressing detection in the standby status, if the enabled key to which the function is assigned is not pressed and a press of an enabled key to which the function is not assigned is not released.

8. The portable device of claim 7, wherein
   the control means detects a pressed key in response to an event of a press of the key on the key matrix circuit when the key selection is not performed by the key selecting means, and detects a pressed key in response to an event of a press of the enabled key when the key selection is performed by the key selecting means.

9. The portable device of claim 7, further comprising a time counting means starting time counting in response to an event of a press of the enabled key and outputting a time counting signal indicating passage of a predetermined time when the predetermined time has passed from the start of time counting.

10. A portable device provided with a first housing having a receiver and a display unit, and a second housing having a transmitter and a key operation unit, the first and second housings being foldable via a joining unit, and the second housing provided with an inside operation key that exists on an inside when being in a folded state and an outside operation key that exists on an outside when being in the folded state, the portable device comprising:
- a folding detecting means detecting whether or not the first housing and second housing are folded; and
- a control means including
- a first key detecting unit detecting which key is pressed if the inside operation key or the outside operation key is pressed; and
- a second key detecting unit detecting a press of the outside operation key at a regular interval if folding of the first housing and second housing is detected by the folding detecting means and a press of the inside operation key is detected,
- wherein if the folding detecting means detects folding of the first housing and second housing and the first key detecting unit detects that the inside operation key is pressed, the control means keeps a CPU of the portable device in a standby status for a predetermined time and repeats the standby status and an awake status of the CPU, and
- the press of the outside operation key is detected at a regular interval by repeating of the standby status and the awake status of the CPU.

11. The portable device of claim 10, wherein
the second key detecting unit detects a press of the outside operation key at a regular interval if folding of the first housing and second housing is detected by the folding detecting means and a press of the outside operation key is detected.

12. The portable device of claim 10, wherein
the first housing and/or the second housing is provided with a detecting means that detects whether or not the first housing and the second housing are folded.

13. A key control method for controlling a key matrix circuit in which keys are arranged in a plurality of rows and columns, comprising the stops of:
- selecting the key by making the keys disabling or enabling by either line of the rows or the columns on the key matrix circuit being used as a unit;
- detecting a pressed key at a predetermined time interval when key selection is not performed, and stopping detection of key pressing during a time span from a press of an enabled key until passage of a predetermined time and resuming the detection of key pressing after the passage of the predetermined time when the key selection is performed to check a press of an enabled key to which a function is assigned; and
- starting the function which is assigned, if the enabled key to which the function is assigned is pressed, and keeping the key pressing detection in the standby status, if the enabled key to which the function is assigned is not pressed and a press of an enabled key to which the function is not assigned is not released.

14. The key control method of claim 13, comprising a stop of detecting a pressed key in response to an event of a press of the key on the key matrix circuit when the key selection is not performed and detecting a pressed key in response to an event of a press of the enabled key when the key selection is performed.

15. The key control method of claim 13, comprising a stop of starting time counting in response to an event of a press of the enabled key and outputting a time counting signal indicating passage of a predetermined time when the predetermined time has passed from the start of time counting.

* * * * *

UNITED STATES PATENT AND TRADEMARK OFFICE
CERTIFICATE OF CORRECTION

PATENT NO. : 8,269,655 B2
APPLICATION NO. : 12/112689
DATED : September 18, 2012
INVENTOR(S) : Kiyomi Minato et al.

It is certified that error appears in the above-identified patent and that said Letters Patent is hereby corrected as shown below:

Column 20, Line 3, In Claim 13, delete "comprising the stops of:" and insert -- comprising: --, therefor.
Column 20, Line 21-22, In Claim 14, after "comprising" delete "a stop of".
Column 20, Line 27-28, In Claim 15, after "comprising" delete "a stop of".

Signed and Sealed this
Twenty-ninth Day of January, 2013

David J. Kappos
*Director of the United States Patent and Trademark Office*